(12) United States Patent
Morishima

(10) Patent No.: US 6,442,087 B1
(45) Date of Patent: Aug. 27, 2002

(54) SEMICONDUCTOR MEMORY DEVICE WITH REDUCED INTERFERENCE BETWEEN BIT LINES

(75) Inventor: Chikayoshi Morishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/968,038

(22) Filed: Oct. 2, 2001

(30) Foreign Application Priority Data

Nov. 30, 2000 (JP) ........................................ 2000-364258

(51) Int. Cl.⁷ ................................................ G11C 7/00
(52) U.S. Cl. .................................. 365/203; 365/230.03
(58) Field of Search .......................... 365/230.03, 203, 365/204, 230.06, 189.01

(56) References Cited

U.S. PATENT DOCUMENTS 5,602,774 A * 2/1997 Elrabaa et al. .............. 365/177
5,808,950 A * 9/1998 Suzuki ................... 365/189.01
6,233,197 B1 * 5/2001 Agrawal et al. ............. 365/156

FOREIGN PATENT DOCUMENTS

| JP | 4-186671 | 7/1992 |
| JP | 5-109287 | 4/1993 |

* cited by examiner

Primary Examiner—Hoai V. Ho
Assistant Examiner—Thong Le
(74) Attorney, Agent, or Firm—McDermott, Will & Emery

(57) ABSTRACT

Among bit line pairs, the bit line adjacent to the bit line connected to a selected memory cell is maintained in the precharged state, and the bit lines in each pair are disposed sandwiching the bit line of another bit line pair. In a static semiconductor memory device, inter-bit-line interference in the memory cell data reading is reduced, and a changing rate of a bit line voltage amplitude is increased.

12 Claims, 20 Drawing Sheets

SEMICONDUCTOR MEMORY DEVICE WITH REDUCED INTERFERENCE BETWEEN BIT LINES

BACKGROUND OF THE INVENTION

1. Field of the Invention

The present invention relates to a static semiconductor memory device, and particularly a structure for rapidly and accurately reading out data. More particularly, the invention relates to a structure for reducing interference between bit lines upon reading out of memory cell data in a semiconductor memory device.

2. Description of the Background Art

FIG. 17 schematically shows a whole structure of a conventional static semiconductor memory device. In FIG. 17, the semiconductor memory device includes a memory cell array MA having memory cells arranged in rows and columns. FIG. 17 shows, by way of example, memory cells M1–M8 arranged in two rows and four columns. Word lines WL are arranged corresponding to the memory cell rows, respectively, and bit line pairs are arranged corresponding to the memory cell columns, respectively. In FIG. 17 there are shown, as a representative, a word line WL1 arranged corresponding to the row of memory cells M1–M4 and a word line WL2 arranged corresponding to the row of memory cells M5–M8. As for the bit line pairs, there are shown bit lines B1 and /B1–B4 and /B4 in FIG. 17.

The semiconductor memory device further includes: a bit line precharge circuit 11 for precharging these bit lines B1 and /B1 to B4 and /B4 to a power supply voltage level in response to a clock signal T; a row decode circuit 14 operating in synchronization with clock signal T and decoding a row address signal X applied thereto to drive a word line corresponding to the addressed row to the selected state; a column decode circuit 5 for decoding column address signals Y0 and Y1 applied thereto to drive one of column select signals DY1–DY4 selecting an addressed column to the selected state; a read/write circuit 6 operating in synchronization with clock signal T and reading and writing data in accordance with a write signal WE; and a multiplexer 2 for coupling a bit line pair corresponding to the selected column to read/write circuit 6 via internal data lines DL and /DL in accordance with column select signals DY1–DY4 received from column decode circuit 5.

Multiplexer 2 includes column select gates CG arranged corresponding to the respective memory cell columns. In FIG. 17, there are shown column select gates CG1–CG4 arranged corresponding to bit lines B1 and /B1 to B4 and /B4 in four columns, and made conductive when corresponding column select signals DY1–DY4 are active, respectively.

Bit line precharge circuit 11 includes bit line load circuits L1–L4 arranged corresponding to bit line pairs B1 and /B1 to B4 and /B4, respectively. Each of bit line load circuits L1–L4 includes a P-channel MOS transistor P1 for precharging a corresponding bit line B (B1–B4) to the power supply voltage level when turned on, and a P-channel MOS transistor P2 for precharging a complementary bit line /B (/B1–/B4) to the power supply voltage level when turned on.

Each of column select gates CG1–CG4 included in multiplexer 2 includes N-channel MOS transistors NI and N2, which are turned on, when corresponding column select signal DYi (i=1–4) is selected, to connect corresponding bit lines B and /B to internal data lines DL and /DL, respectively.

The static semiconductor memory device shown in FIG. 17 is a clock synchronous semiconductor memory device, which performs selection of a row and a column as well as write/read of data in synchronization with clock signal T. When clock signal T is at L level, all bit line load circuits L1–L4 are activated in bit line precharge circuit 11, and bit lines B1 and /B1 to B4 and /B4 are precharged to power supply voltage VCC level by corresponding P-channel MOS transistors P1 and P2. Row decode circuit 14 and column decode circuit 5 are inactive, and word lines WL1 and WL2 as well as column select signal DYi are in the unselected state.

When clock signal T attains H level, the memory select operation and access operation are performed. More specifically, row decode circuit 14 is activated to decode a row address signal X, for driving a word line WL (WL1 or WL2) corresponding to the addressed row to the selected state. At the same time, column address signals Y0 and Y1 are applied, and column decode circuit 5 is activated in synchronization with the rising of clock signal T to perform the decoding of the column address, for driving one of column select signals DY1–DY4 to the selected state in accordance with the result of decoding. Responsively, bit lines B and /B corresponding to the selected column are coupled to internal data lines DL and /DL, respectively.

In the data read operation, the voltages on bit lines B and /B precharged to the power supply voltage level, change in accordance with data stored in the selected memory cell, and a sense amplifier circuit included in read/write circuit 6 amplifies the voltage difference between the bit lines corresponding to this selected column to produce read data. In the data write operation, a write circuit included in read/write circuit 6 produces complementary internal write data in accordance with externally supplied write data, for transmission to bit lines B and /B corresponding to the selected column. In this data write operation, one of bit lines B and /B precharged to the power supply voltage level is driven to the ground voltage level in accordance with the internal write data.

In FIG. 18A, there is shown, by way of example, a structure of row decode circuit 14 shown in FIG. 17. In FIG. 18A, row decode circuit 14 includes an inverter circuit 14a for inverting row address signal X, an AND circuit 14b receiving an output signal of inverter circuit 14a and clock signal T, and transmitting a word line drive signal onto word line WL1, and an AND circuit 14c receiving clock signal T and row address signal X, and transmitting a word line drive signal onto word line WL2.

Row decode circuit 14 shown in FIG. 18A includes an AND type decode circuit as a unit decode circuit. Word lines WL2 and WL1 are selectively designated in accordance with H and L levels of row address signal X. A decode operation of row decode circuit 14 shown in FIG. 18A will now be briefly described with reference to a timing chart of FIG. 18B.

When clock signal T is at L level, the output signals of AND circuits 14b and 14c are at L level, and both word lines WL (WL1 and WL2) are at L level. In FIG. 18B, externally applied row address signal X applied, for example, from a processor changes in synchronization with the falling of clock signal T.

When clock signal T rises to H level, AND circuits 14b and 14c are enabled, and one of word lines WL1 and WL2 is driven to the selected state in accordance with row address signal X. When row address signal X is at H level, AND circuit 14c transmits the word line drive signal onto word line WL2, and word line WL2 is driven to the selected state. When row address signal X is at L level, AND circuit 14b activates the word line drive signal to drive word line WL1 to the selected state. When clock signal T falls to L level, both of the output signals of AND circuits 14b and 14c attain L level, and the memory cell access cycle ends. Accordingly, word lines WL1 and WL2 attain the unselected state, and bit line precharge circuit 11 shown in FIG. 17 precharges bit lines B and /B to the power supply voltage level.

FIG. 19 shows, by way of example, a structure of memory cells M1–M8 shown in FIG. 17. FIG. 19 shows memory cell M1 as a representative. These memory cells M1–M8 have the same structure.

In FIG. 19, memory cell M1 includes; a P-channel MOS (insulated gate type field effect) transistor TR1 which is connected between a power supply node and a storage node SNA, and has a gate connected to a storage node SNB; a P-channel MOS transistor TR2 which is connected between the power supply node and storage node SNB, and has a gate connected to storage node SNA; an N-channel MOS transistor TR3 which is connected between storage node SNA and the ground node, and has a gate connected to storage node SNB; an N-channel MOS transistor TR4 which is connected between storage node SNB and the ground node, and has a gate connected to storage node SNA; an N-channel MOS transistor TR5 which is turned on to connect storage node SNA to bit line B1 in response to the word line drive signal on word line WL1; and an N-channel MOS transistor TR6 which is turned on to connect storage node SNB to bit line /B1 in response to the word line drive signal on word line WL1. In memory cell M1 shown in FIG. 19, MOS transistors TR1 and TR3 form a CMOS inverter circuit, MOS transistors TR2 and TR4 form a CMOS inverter circuit, and these inverter circuits form a latch circuit. Thus, storage nodes SNA and SNB store data complementary to each other.

When word line WL1 is in the selected state, MOS transistors TR5 and TR6 are turned on to connect storage nodes SNA and SNB to bit lines B1 and /B1, respectively. Accordingly, one of bit lines B1 and /B1 precharged to the power supply voltage level is discharged in accordance with the data stored on storage nodes SNA and SNB, and the voltage level of the one bit line lowers.

In the operation of reading the memory cell data, bit line precharge circuit 11 shown in FIG. 17 is inactive so that bit lines B1 and /B1 are in the floating state, and the voltage level of one of bit lines B1 and /B1 lowers at a certain rate to a certain level. The voltage lowering rate and the attained voltage level are determined by the load capacitance of bit line B and /B and the current drive capability of MOS transistors TR3 and TR4. The voltage difference, appearing between bit lines B1 and /B1, is transmitted via the corresponding column select gate to read/write circuit 6, and is differentially amplified by the sense amplifier circuit included read/write circuit 6, so that the data is read out.

FIG. 20 schematically shows, by way of example, a structure of read/write circuit 6 shown in FIG. 17. In FIG. 20, read/write circuit 6 includes: an inverter circuit 6a which inverts write signal WE; an AND circuit 6b which receives clock signal T and an output signal of inverter circuit 6a, and produces a sense amplifier enable signal SAE; an AND circuit 6c which receives clock signal T and write signal WE, and produces write driver enable signal WDE; a sense amplifier 6d which is activated, when sense amplifier enable signal SAE is active, to differentially amplify the voltage difference appearing between internal data lines DL and /DL for producing external read data DQ; and a write driver 6e which is activated, when write driver enable signal WDE is active, to produce complementary internal write data from external data DQ for transmission onto internal data lines DL and /DL.

Sense amplifier 6d is formed of a differential amplifier circuit, and differentially amplifies a relatively small voltage difference appearing between internal data lines DL and /DL to produce the external read data. Write driver 6e has a relatively large current drive capability, and produces complementary internal write data in accordance with external data DQ to set the storage data of a selected memory cell to the logical level corresponding to the write data. Therefore, the current drive capability of write driver 6e is sufficiently larger than the latching capability of the latch circuit of memory cell M.

In the structure of read/write circuit 6 shown in FIG. 20, when clock signal T is at L level, both sense amplifier enable signal SAE and write driver enable signal WDE are at L level, and both sense amplifier 6d and write driver 6e are inactive. Thus, read/write of data is not performed. When clock signal T rises to H level, AND circuits 6b and 6c are enabled, and one of sense amplifier enable signal SAE and write driver enable signal WDE is activated in accordance with write signal WE. When write signal WE is at L level, sense amplifier enable signal SAE is activated, and responsively, sense amplifier 6d differentially amplifies the voltage difference between internal data lines DL and /DL. When write signal WE is at H level, write driver enable signal WDE is activated, and write driver 6e produces the internal write data in accordance with the external write data, for transmission onto internal data lines DL and /DL.

FIG. 21 is a signal waveform diagram representing a data read operation of sense amplifier 6d shown in FIG. 20. When clock signal T attains H level as shown in FIG. 21, row decode circuit 14 shown in FIG. 18A is activated to drive word line WL, arranged corresponding to the addressed row, to the selected state. In this state, bit line precharge circuit 11 shown in FIG. 17 is inactive and the voltage levels of bit lines BL and /BL change in accordance with the stored data of memory cell. In parallel with this word line selecting operation, column decode circuit 5 (see FIG. 17) performs the column select operation, and the voltage levels of the bit line pair corresponding to the selected column are transmitted onto internal data lines DL and /DL, and accordingly the voltage levels of internal data lines DL and /DL change. FIG. 21 represents the operation in the case where internal data lines DL and /DL are precharged to the power supply voltage level. Sense amplifier 6d amplifies the voltage difference between internal data lines DL and /DL to produce the external read data in accordance with activation of sense amplifier enable signal SAE.

Therefore, sense amplifier 6d differentially amplifies the minute voltage difference appearing on internal data lines DL and /DL so that fast reading of the data can be achieved. Data Q0 and Q1 externally read out are taken, e.g., by an external processor in synchronization with the falling of clock signal T, and the processing of the read data starts in the following cycle of clock signal T.

Since sense amplifier 6d amplifies the differential data, it is preferable for fast reading of the data to apply as large a voltage difference as possible to sense amplifier 6d in a short time.

FIG. 22 schematically shows a planar layout of active regions (impurity regions) of memory cells M1–M4 arranged in one row and four columns. In FIG. 22, U-shaped impurity regions (active regions) 20 are aligned in the row direction, and T-shaped impurity regions (active regions) 21 are aligned with U-shaped impurity regions 20, respectively in the column direction. U-shaped impurity region 20 is divided into left and right half impurity regions 20a and 20b. T-shaped impurity region 21 is divided into left and right half impurity regions 21a and 21b.

One memory cell M (M1–M4) is formed of left half region 20a of U-shaped impurity region 20, right half region 20b of adjacent U-shaped impurity region 20 and impurity regions 21a and 21b facing to these impurity regions 20a and 20b, respectively, as depicted by broken lines in FIG. 22. U-shaped impurity region 20 is used for forming an accessing transistor and a driving transistor (i.e., discharging transistor in a latch circuit) of memory cell M. Thus, N-channel MOS transistors are formed in U-shaped active region 20. T-shaped active region 21 is used for forming a pull-up P-channel MOS transistor in the latch circuit of the memory cell M. Active regions 20 and 21 shown in FIG. 22 are arranged repetitively in the row direction, and are also arranged repetitively in the column direction with a mirror-inversion relationship.

FIG. 23 schematically shows a layout of interconnection lines for active regions 20 and 21 shown in FIG. 22. In FIG. 23, first metal interconnection lines (first-level metal interconnection lines) 24a–24f extending in the column direction in the memory cell regions are arranged corresponding to active regions 20a, 20b, 21a and 21b. First metal interconnection line 24a is electrically connected to active region 20b via a first contact (contact between the first metal interconnection line and the active region) 22a. First metal interconnection line 24b is electrically connected to active region 21b via first contact 22b. Polycrystalline silicon interconnection lines 23a extending in the column direction are arranged near first metal interconnection lines 24a and 24b. Polycrystalline silicon interconnection line 23a forms gate electrodes of the transistors, which form a latch circuit in the memory cell.

A first metal interconnection line 24d is arranged near polycrystalline silicon interconnection line 23a. First metal interconnection line 24d is connected to active region 20b via a first contact 22c, and is also electrically connected to active region 21b via a first contact 22d. First metal interconnection line 24c is arranged in parallel with active region 20b and extending in the column direction. First metal interconnection line 24c is connected to active region 20b via a first contact 22f A polycrystalline silicon interconnection line 27 extending in the row direction is arranged near first contact 22f Polycrystalline silicon interconnection line 27 forms word line WL, extends in the row direction, and crosses U-shaped active regions 20 shown in FIG. 22 to form gates of the access transistors of the memory cells aligned in the row direction.

First metal interconnection lines 24e and 24f are arranged extending in the column direction and adjacent to first metal interconnection lines 24c and 24d, respectively, in the memory cell region. First metal interconnection line 24e is electrically connected via a first contact 22g to underlying active region 20a. First metal interconnection line 24f is connected electrically via a first contact 22h to active region (impurity region) 20a formed beneath. Further, first metal interconnection line 24f is connected to active region 21a via a first contact 22i. A polycrystalline silicon interconnection line 23b is arranged extending in the column direction and adjacent to first metal interconnection line 24f in the memory region. Polycrystalline silicon interconnection line 23b is connected to first metal interconnection line 24d via a first contact 22e. Polycrystalline silicon interconnection line 23a is connected to first metal interconnection line 24f via a first contact 22e. First metal interconnection lines 24d and 24f form storage nodes of the memory cell.

First metal interconnection lines 24a and 24b are arranged corresponding to active regions 20 and 21, respectively, near polycrystalline silicon interconnection line 23b. First metal interconnection lines 24a and 24b are electrically connected to the corresponding active regions via first contacts, respectively. First metal interconnection lines 24a and 24b adjacent to polycrystalline silicon interconnection line 23b form power supply nodes of the memory cells.

In the interconnection line layout shown in FIG. 23, first metal interconnection line 24a forms a ground node for transmitting the ground voltage, and first metal interconnection line 24b forms a power supply node for transmitting the power supply voltage. Polycrystalline silicon interconnection lines 23a and 23b form transistor gates of MOS transistors forming the latch circuits in the memory cells. First metal interconnection lines 24c and 24e form leader interconnection lines for connecting the access transistors of the memory cells to the corresponding bit lines. First metal interconnection lines 24d and 24f form storage nodes for storing complementary data of the memory cells.

The interconnection lines for transmitting the power supply voltage and the ground voltage are arranged in a region between the memory cells. The first metal interconnection lines forming the power supply nodes and the storage nodes are arranged with substantially equal pitches in the row direction, and an intermediate interconnection lines for bit line connection in one memory cell are spaced from each other in the row direction by an extremely small distance. Thus, the memory cells are arranged in a high density.

The interconnection line layout shown in FIG. 23 is repeated in the row direction, and is repeated in the column direction in a mirror-inversion fashion.

FIG. 24 schematically shows a layout of second level metal interconnection lines arranged above the interconnection line layout shown in FIG. 23. In FIG. 24, second level metal interconnection lines (referred to simply as second interconnection line) 30a and 30b are arranged corresponding to first metal interconnection lines 24a and 24b, respectively. These second metal interconnection lines 30a and 30b are electrically connected to corresponding first metal interconnection lines 24a and 24b via second contacts 31a and 31b, respectively, although first metal interconnection line 24b is not shown in FIG. 24.

Second metal interconnection lines 32a and 32b are aligned to first metal interconnection lines 24c and 24e shown in FIG. 23, and are connected via second contacts 31c and 31d to corresponding first metal interconnection lines 24c and 24e arranged beneath, respectively. These second metal interconnection lines 32a and 32b form the bit lines, and are coupled to corresponding bit line load circuits.

FIG. 25 schematically shows a layout of third metal interconnection lines arranged above the interconnection line layout shown in FIG. 24. In FIG. 25, a third level metal interconnection line (referred to simply as third interconnection line) 37 is arranged crossing second metal interconnection lines 32a and 32b. A third metal interconnection line 35 is arranged parallel to third metal interconnection line 37 and extending in the row direction to cross second metal interconnection line 30a. Further, a third metal interconnection line 36 is arranged extending in the row direction to cross second metal interconnection line 30b. Third metal interconnection line 37 is electrically connected at a portion, not shown in the figure, to polycrystalline silicon interconnection line 27 forming word line WL shown in FIG. 23, and transmits a word line drive signal to the gates of the access transistors of a corresponding row at high speed.

Third metal interconnection line 35 is electrically connected to second metal interconnection line 30a via a third contact 34a, and third metal interconnection line 36 is electrically connected to second metal interconnection line 30b via a third contact 34b. Third metal interconnection line 35 transmits ground voltage GND, and third metal interconnection line 36 transmits power supply voltage VCC.

In the interconnection line layout shown in FIG. 25, each bit line pair is formed of second metal interconnection lines 32a and 32b, which form a pair and are located between adjacent two contact sets each including third contacts 34a and 34b aligned in the column direction. FIG. 25 shows bit lines B1 and /B1 to B4 and /B4. These bit lines are formed of the second metal interconnection lines, and are arranged in the same conductive layer. Therefore, a parasitic capacitance C1 or C2 is present between the second metal interconnection lines adjacent to each other with an interlayer insulating film interposed. These parasitic capacitances C1 and C2 act as follows.

For bit line pairs B2, /B2, B3 and /B3 shown in FIG. 26, it is now assumed that data at H level is read onto bit lines B2 and B3, and data at L level is read onto bit lines /B2 and /B3. In this state, bit lines B2 and B3 are already precharged to H level (power supply voltage level) by the bit line load circuit. In the operation of reading data at H level, the voltage levels of bit lines B2 and B3 do not change. Bit lines /B2 and /B3 are discharged toward the ground voltage level via the drive transistors (MOS transistors TR4 in FIG. 19) in the selected memory cells.

Parasitic capacitance C1 is present between bit lines B2 and /B2, parasitic capacitance C2 is present between bit lines /B2 and B3, and parasitic capacitance C1 is present between bit lines B3 and /B3.

When voltage levels of bit lines /B2 and /B3 change in the operation of reading memory cell data, this voltage change is therefore transmitted to bit line B3 via parasitic capacitances C1 and C2, and the voltage level of bit lines B3 to be held at H level lowers through the capacitive coupling, as shown in FIG. 27. When the voltage level of bit line B3 lowers, the pull-up transistor (MOS transistor TR1 in FIG. 19) of the memory cell may supply the current, but does not have a capability of compensating for the lowering of the voltage level of bit line B3. Therefore, this capacitance coupling acts to reduce a voltage difference $\Delta V$ between bit lines B3 and /B3 in the operation of reading the memory cell data (i.e., the changing rate of the amplitude between the bit lines decreases). In the normal state, at a time ta, the sense margin for the sense amplifier is sufficiently large, and the sense operation is to be performed for reading the memory cell data at the time ta. In the case where the capacitive coupling is present, however, it is necessary to read the data by activating the sense amplifier at a time tb for producing voltage difference $\Delta V$ of the same magnitude as that in the case where no capacitive coupling is present. Therefore, such a problem arises that the data cannot be read fast. If the sense amplifier is activated at a faster timing, the sense margin is insufficient, and erroneous data reading may result.

In particular, if the elements have miniaturized structures and the bit line pitch is accordingly made small, the value of capacitance between the bit lines becomes large to increase the influence by the interference between the bit lines, and accurate and fast reading of data may be impossible.

For reading the data as fast as possible, it is necessary to read the data via the sense amplifier while the voltage difference between the bit lines is small. If the voltage difference between the bit lines changes due to the interference between the bit lines caused by the above capacitive coupling, such a problem arises that the data cannot be read fast and accurately.

Japanese Patent Laying-Open No. 4-186671 discloses a structure for reducing noises between memory cells in a static semiconductor memory device. In this prior art, consideration is given to the ground voltage noises caused by the discharging current flowing to a ground line provided corresponding to each memory cell row when a memory cell is selected. However, no consideration is given to the decrease in the read voltage difference (voltage difference between the paired bit lines) due to the interference between the bit lines, and no countermeasures are taken against the inter-bit-line interference.

Further, a structure for reducing the inter-bit-line noises in a dynamic semiconductor memory device (DRAM) is disclosed in Japanese Patent Laying-Open No. 5-109287. This prior art reference discloses a structure, in which the bit lines have a so-called twist bit line structure for causing a common phase noises on paired bit lines. Although this prior art reference discloses a structure, in which paired bit lines are arranged sandwiching a bit line of another bit line pair, this structure is a so-called "pseudo two intersection point memory cell structure", which complicates the layout for crossing the bit lines. Further, no consideration is given to the structure, in which the bit lines in a pair are connected to one memory cell, and the memory cell data are simultaneously read onto the paired bit lines. In this prior art reference, no consideration is given to a way of selecting a memory cell for reducing the inter-bit-line interference.

SUMMARY OF THE INVENTION

An object of the present invention is to provide a static semiconductor memory device, in which data can be read out fast and accurately while suppressing inter-bit-line interference.

Another object of the invention is to provide a static semiconductor memory device having a bit line layout, in which inter-bit-line interference can be easily suppressed.

A static semiconductor memory device according to the present invention includes a plurality of static memory cells arranged in rows and columns, and a plurality of word lines arranged, by a predetermined number, for each row of the memory cells. The memory cells aligned in the same row are connected to predetermined word lines among the predetermined number of word lines in a corresponding row.

The static semiconductor memory device according to the present invention further includes: a plurality of bit line pairs arranged corresponding to the columns of the memory cells, and are connected to the memory cells in the corresponding columns, respectively; and a bit line precharge/control circuit for maintaining the bit line arranged corresponding to the column adjacent to a selected column in a precharged state in accordance with a column address signal. The bit lines in each pair are arranged sandwiching a bit line of another bit line pair.

Upon selection of a memory cell, at least one of the adjacent columns is in the unselected state, and no selected memory cell data is read onto the adjacent one. Therefore, the memory cell data is not simultaneously read onto columns adjacent to each other, and change in read voltage of the memory cell data is not caused by the capacitive coupling via a parasitic capacitance between the bit lines. Therefore, it is possible to suppress inter-bit-line interference for the selected memory cell data, and it is possible to suppress reduction in voltage difference between the bit lines. Therefore, an inter-bit-line amplitude can be changed fast, and fast and accurate reading of data can be performed.

By maintaining the unselected bit line on the adjacent columns in the precharged state, this unselected bit line can be utilized as a shield layer, and the inter-bit-line interference can be reliably suppressed. In particular, the paired bit lines are arranged sandwiching the bit line of another bit line pair so that the inter-bit-line interference can be reliably suppressed in each bit line pair, and the accurate and fast reading of data can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
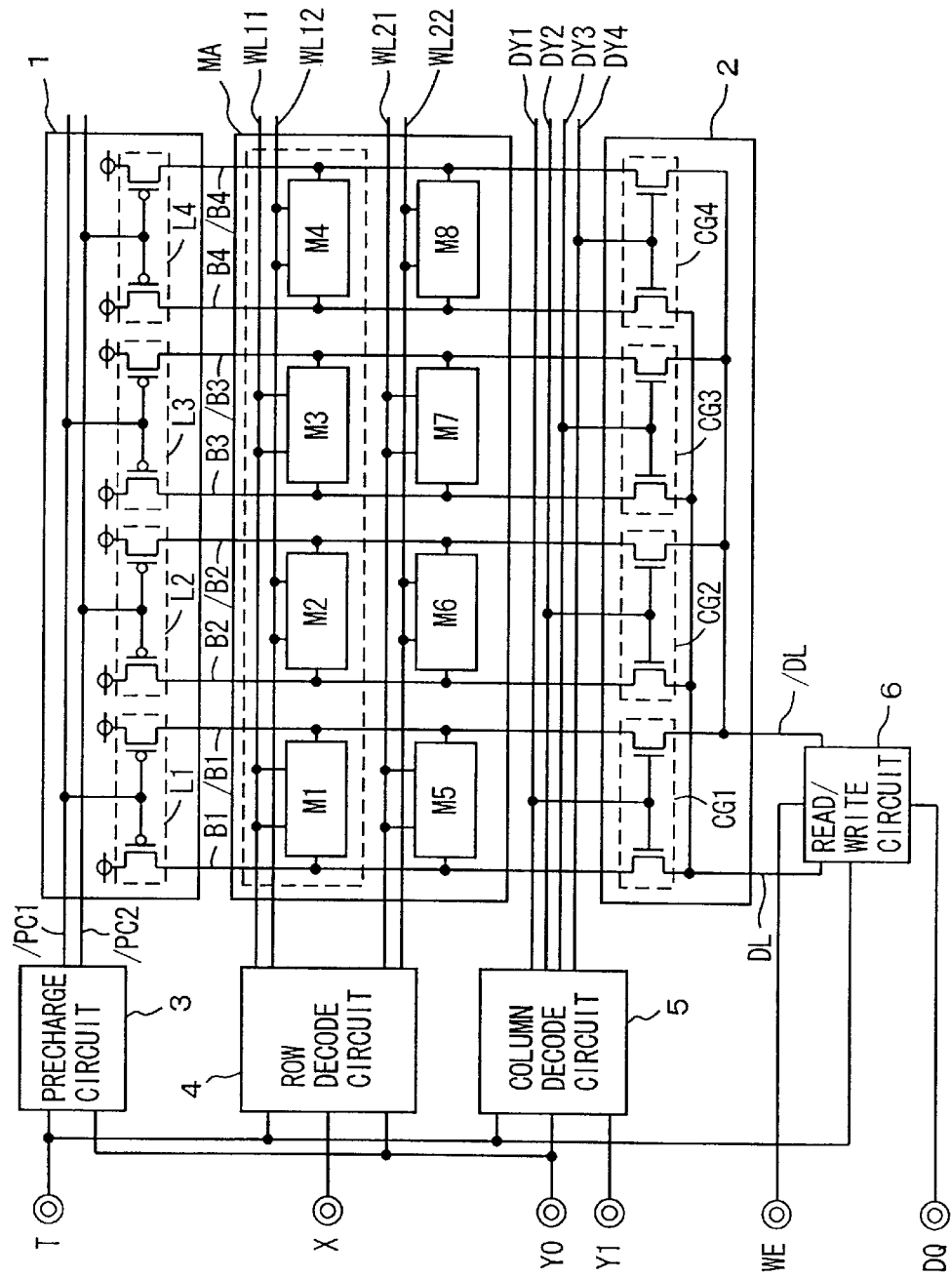
FIG. 1 schematically shows a whole structure of a semiconductor memory device according to a first embodiment of the invention.

FIG. 1 schematically shows a whole structure of a static semiconductor memory device according to a first embodiment of the present invention. In FIG. 1, a memory cell array MA includes static memory cells M in rows and columns, similarly to a conventional one. FIG. 1 representatively shows memory cells M1–M8 arranged in two rows and four columns.

In the first embodiment, two word lines WLi1 and WLi2 are arranged for each memory cell row. Word line WL11 is connected to the memory cells in the odd-numbered columns, and word line WL12 is connected to the memory cells in the even-numbered columns. In FIG. 1, word lines WL11 and WL12 are arranged for memory cells M1–M4 arranged in one row, and word lines WL21 and WL22 are arranged for memory cells M5–M8 arranged in another row. Memory cells M1 and M3 are connected to word line WL11, and memory cells M2 and M4 are connected to word line WL12. Memory cells M5 and M7 are connected to word line WL21. Memory cells M6 and M8 are connected to word line WL22.

Bit line pairs B1 and /B1–B4 and /B4 are arranged for the respective columns of the memory cells. Bit lines Bi and /Bi (i=1–4) in a pair are connected to the memory cells in the corresponding column. In bit line precharge circuit 1, bit line load circuits L1–L4 are arranged for bit line pairs B1 and /B1–B4 and /B4, respectively.

Bit line load circuits L1–L4 are selectively activated and deactivated in accordance with a selected word line. Activation and deactivation of bit line load circuits L1–L4 are controlled by a precharge control circuit 3. Precharge control circuit 3 receives a clock signal T and column address signal Y0, and selectively deactivates precharge signals /PC1 and /PC2. Precharge signal /PC1 is applied to bit line load circuits L1 and L3 provided for the odd-numbered columns.

Precharge signal /PC2 is applied to bit line load circuits L2 and L4 provided for the even-numbered columns. In a memory cell access operation, one of precharge signals /PC1 and /PC2 is activated, and the other is deactivated. Therefore, for reading the memory cell data onto the bit lines in the odd-numbered columns from selected memory cells, the bit line load circuits for the even-numbered columns maintain the active state, and continues the precharging.

Word lines WL11 and WL12 are connected to the memory cells in the odd- and even-numbered columns, respectively, and word lines WL21 and WL22 are likewise connected to the memory cells in the odd- and even-numbered columns, respectively. When row decode circuit 4 selects one word line WLji, the memory cells in the even-numbered or odd-numbered columns are selected in the j-th row, and the other memory cells in the j-th row are maintained in the unselected state. The bit lines corresponding to the unselected memory cell columns are held in the precharged state so that the generation of capacitive coupling noises to the bit lines on the selected columns is suppressed.

Row decode circuit 4 receives an X-address signal X, clock signal T and a column address signal Y0. Column address signal Y0 specifies the even- and odd-numbered columns. Row decode circuit 4 operates in accordance with column address signal Y0, and drives the word line, which is connected to the memory cells in the even- or odd-numbered columns designated by column address signal Y0, among the word lines corresponding to the row designated by X-address signal X.

Column decode circuit 5 decodes column address signals Y0 and Y1 in synchronization with clock signal T, and drives one of column select signals DY1–DY4.

Similarly to the conventional case, there are arranged a multiplexer 2 for connecting the bit lines corresponding to a selected column to internal data lines DL and /DL in accordance with column select signals DY1–DY4. Similarly to the conventional case, multiplexer 2 includes column select gates CG1–CG 4 provided corresponding to bit line pairs B1 and /B1–B4 and /B4 and selectively turned on to connect the corresponding bit line pairs to internal data lines DL and /DL in accordance with column select signals DY1–DY4, respectively.

Internal data lines DL and /DL are coupled to read/write circuit 6 receiving write signal WE and clock signal T. Brief description will now be given on an operation of the static semiconductor memory device shown in FIG. 1 with reference to a timing chart of FIG. 2.

When clock signal T is at L level, precharge control circuit 3 holds both precharge signals /PC1 and /PC2 at L level, and all bit line load circuits L1–L4 in bit line precharge circuit 1 are activated. Thus, all bit line pairs B1 and /B1–B4 and /B4 are precharged to H level. Further, row and column decode circuits 4 and 5 are inactive to produce output signals at L level, because clock signal T is at L level.

Figure 2:
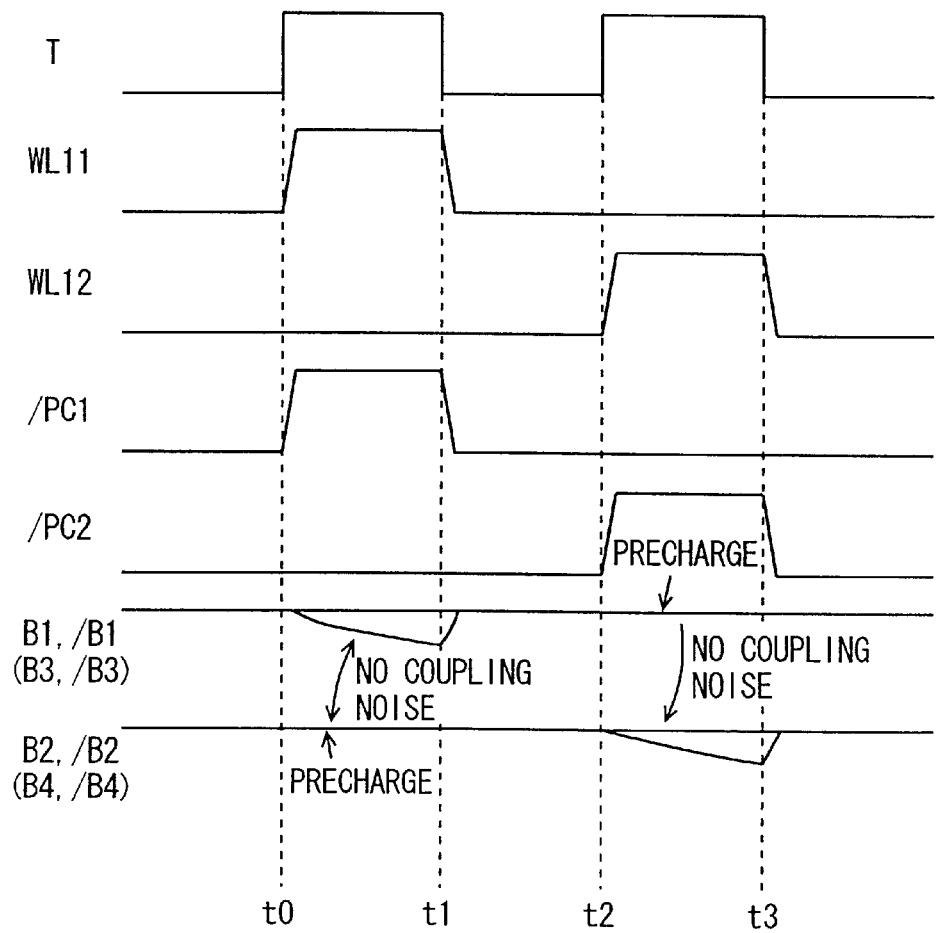
FIG. 2 is a timing chart representing an operation of the semiconductor memory device shown in FIG. 1.

At a time t0, clock signal T rises to H level, and the memory cell select operation is activated (i.e., the memory access cycle starts). First, precharge control circuit 3 drives one of precharge signals /PC1 and /PC2 to H level, and holds the other at L level. In the example shown in FIG. 2, precharge signal /PC1 is first set to H level, and precharge signal /PC2 is held at L level. Row decode circuit 4 selects an addressed memory cell row, and drives the word line corresponding to the memory cells, which in turn are connected to the bit lines of the column group designated by column address signal Y0, in the selected row to the selected state. In FIG. 2, word line WL11 is driven to the selected state. In this state, memory cells M1 and M3 arranged on the odd-numbered columns are selected, and the memory cell data are read onto bit line pairs B1 and /B1, and B3 and /B3. Responsively, one of bit lines B1 and /B1 is discharged to lower its voltage level, and the other maintains the precharged voltage level (power supply voltage level). In this data read operation, even-numbered bit lines B2 and /B2, and B4 and /B4 maintain the precharged state, and capacitive coupling is not present between the adjacent bit line pairs, and thus the reduction of the voltage difference between the bit lines in each pair can be suppressed, and the voltage between the bit lines can be changed fast (the amplitude between the voltages of the bit lines in a pair can be changed fast). Therefore, the sense amplifier in read/write circuit 6 can be activated for reading out the data at a faster timing.

At a time t1, clock signal T falls to L level. Responsively, the operation of reading data from the memory cell ends, and all bit line load circuits L1–L4 in bit line precharge circuit 1 are activated, and all bit line pairs B1 and /B1–B4 and /B4 are precharged again.

At a time t2, the data reading from the memory cells is performed, with column address Y0 designating the even-numbered columns, again. In this case, precharge control circuit 3 maintains precharge signal /PC1 in the active state at L level, and drives precharge signal /PC2 to the inactive state at H level. Responsively, bit line load circuits L1 and L3 maintain the active state, and bit line load circuits L2 and L4 provided for the even-numbered columns are deactivated to end the precharging operation for the bit line pairs B2, /B2, B4 and /B4 provided for the even-numbered column.

Word line WL12 is driven to the selected state by row decode circuit 4, and the memory cell data are read onto bit lines B2, /B2, B4 and /B4 provided for the even-numbered columns. In this case, bit lines B1, /B1, B3 and /B3 are precharged to H level by the corresponding bit line load circuits kept active, and have the voltage levels thereof fixed to H level. Thus, superimposition of noises on the memory cell data due to the capacitive coupling between the bit lines is prevented. Thus, it is possible to suppress lowering of the voltage level (i.e., H level) of the bit lines in the selected column, and the bit line amplitude can be changed at high speed so that the data can be read out fast.

Column decode circuit 5 drives one of column select signals DY1–DY4 to a selected state in accordance with column address signals Y0 and Y1, and responsively one of column select gates CG1–CG4 is turned on. Thereby, in a memory cell access cycle starting from time t2, the bit lines corresponding to the column designated by column address signal Y1 among the bit lines in the even-numbered columns, are connected to internal data lines DL and /DL, respectively. In read/write circuit 6, write signal WE is at L level (not shown in FIG. 2), and the sense amplifier therein is activated to amplify the data read onto internal data lines DL and /DL for externally outputting.

At a time t3, clock signal T falls to L level. Responsively, the memory array returns to the precharged state, and row decode circuit 4, column decode circuit 5 and read/write circuit 6 return to the inactive state.

As described above, a plurality of word lines are arranged for each row, and are selectively activated in accordance with the group of selected columns. The bit line pair (unselected column) adjacent to the bit line pair (selected column) connected to the selected memory cell in a selected row maintains the precharged state. Thus, superimposition of the capacitive coupling noises on the read memory cell data can be prevented, and reduction of the voltage difference between the bit lines can be suppressed so that the data can be read out fast. Structures of each portion of the memory device according to the first embodiment of the present invention will now be described briefly.

Figure 19:
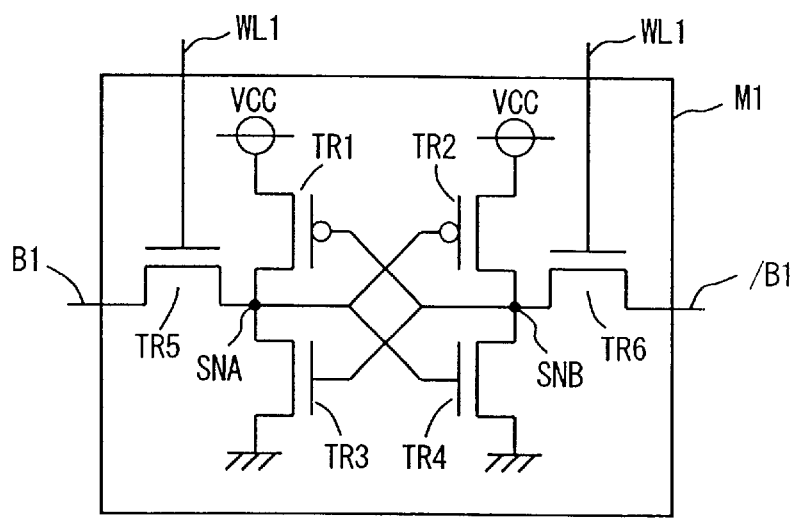
FIG. 19 shows an example of a structure of a memory cell shown in FIG. 17.

Memory cells M1–M8 are the same in structure as the conventional memory cells shown in FIG. 19, and each includes latch circuits (TR1–TR4) formed of CMOS inverters as well as access transistors (TR5 and TR6) formed of N-channel MOS transistors.

[Structure of Precharge Control Circuit 3]

Figure 3:
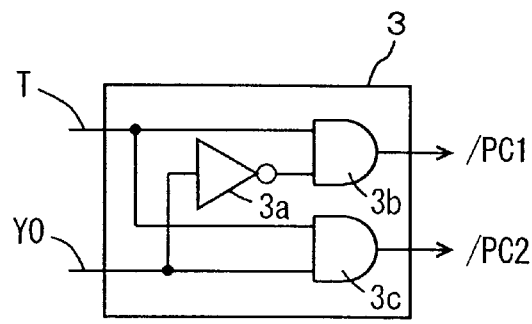
FIG. 3 shows, by way of example, a structure of a precharge control circuit shown in FIG. 1.

FIG. 3 schematically shows a structure of a precharge control circuit 3 shown in FIG. 1. In FIG. 3, precharge control circuit 3 includes: an inverter circuit 3a which inverts column address signal Y0; an AND circuit 3b which receives the output signal of inverter circuit 3a and clock signal T, and produces precharge signal /PC1; and an AND circuit 3c which receives clock signal T and column address signal Y0, and produces precharge signal /PC2.

When clock signal T is at L level, precharge signals /PC1 and /PC2 are both at L level. When clock signal T attains H level, AND circuits 3b and 3c are enabled. When column address signal Y0 is at L level, the output signal of inverter circuit 3a is at H level, and precharge signal /PC1 is at H level. When column address signal Y0 is at H level, the output signal of inverter circuit 3a is at L level, and precharge signal /PC2 generated from AND circuit 3c is at H level. Thus, when column address signal Y0 is at L level, and designates the odd-numbered columns, precharge signal /PC1 for the bit line load circuits provided for the odd-numbered columns is deactivated. In this case, precharge signal /PC2 for bit line load circuits L2 and L4 of the even-numbered columns maintain L level, and the bit lines in these even-numbered columns maintain the precharged state.

When column address signal Y0 is at H level, the even-numbered columns are designated, and precharge signal /PC2 controlling the bit line load circuits for the even-numbered columns attains H level. Precharge signal /PC1 for the bit line load circuits provided to the odd-numbered columns is at L level, and the bit lines in the odd-numbered columns maintain the precharged state.

As described above, with the column address signal specifying a selected column utilized for controlling the bit line precharge operation, the precharge operation for the selected columns can be stopped, and the precharge operation for the unselected columns can be maintained.

[Structure of Row Decode Circuit 4]

Figure 4:
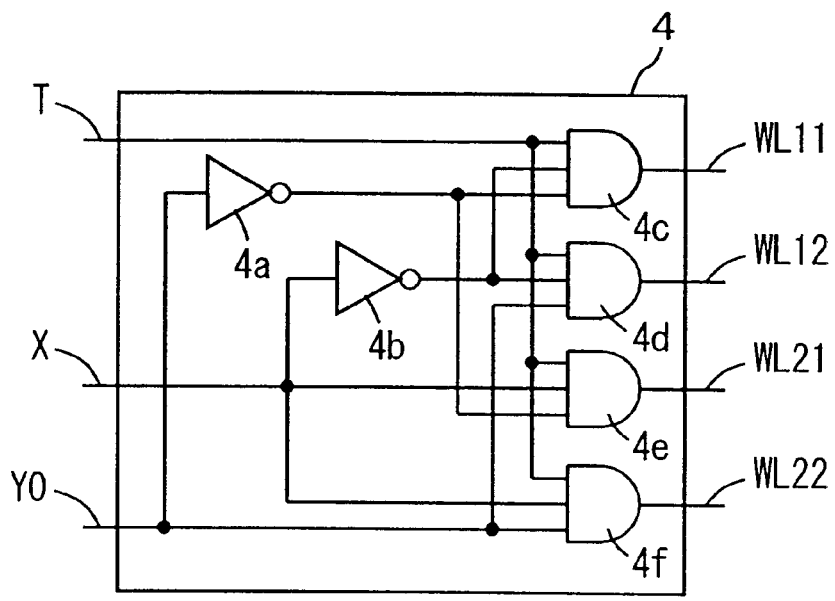
FIG. 4 shows, by way of example, a structure of a row decode circuit shown in FIG. 1.

FIG. 4 shows an example of the structure of row decode circuit 4 shown in FIG. 1. In FIG. 4, row decode circuit 4 includes: an inverter circuit 4a for inverting column address signal Y0; an inverter circuit 4b for inverting X-address signal X, an AND circuit 4c receiving clock signal T and the output signals of inverter circuits 4a and 4b, for producing the word line drive signal for word line WL11; an AND circuit 4d receiving clock signal T, column address signal Y0 and the output signal of inverter circuit 4b, for producing the word line drive signal for word line WL12; an AND circuit 4e receiving clock signal T, X-address signal X and the output signal of inverter circuit 4a, for producing the word line drive signal for word line WL21; and an AND circuit 4f receiving clock signal T, X-address signal X and column address signal Y0, for producing the word line drive signal for word line WL22.

When clock signal T is at L level, all the output signals of AND circuits 4c–4f are at L level, and all word lines WL11, WL12, WL21 and WL22 are at L level.

When clock signal T attains H level, one of the output signals of AND circuits 4c–4f rises to H level in accordance with column address signal Y0 and X-address signal X. When X-address signal X is at H level, AND circuits 4e and 4f drive one of word lines WL21 and WL22 to the selected state. In this state, if column address signal Y0 is at H level, word line WL22 is driven to the selected state. If column address signal Y0 is at L level, word line WL21 is driven to the selected state.

When X-address signal X is at L level, one of word lines WL11 and WL12 is driven to the selected state. When column address signal Y0 is at H level, word line WL12 is driven to the selected state. When column address signal Y0 is at L level, word line WL11 is driven to the selected state.

As described above, column address signal Y0 identifying the even- and odd-numbered columns specifies word lines WL12 and WL22 connected to the memory cells in the even-numbered columns, and one of these word lines WL12 and WL22 is designated by X-address signal X. When column address signal Y0 is at L level, word lines WL11 and WL21 connected to the memory cells in the odd-numbered columns are specified, and one of these word lines WL11 and WL21 is designated by the Xaddress signal X.

Column address signal Y0 identifying even- and odd-numbered columns is applied to precharge control circuit 3 and row decode circuit 4. Thus, the memory cells in the even- or odd-numbered columns are selected, and the unselected columns can be maintained in the precharged state.

[Structure of Column Decode Circuit 5]

Figure 5:
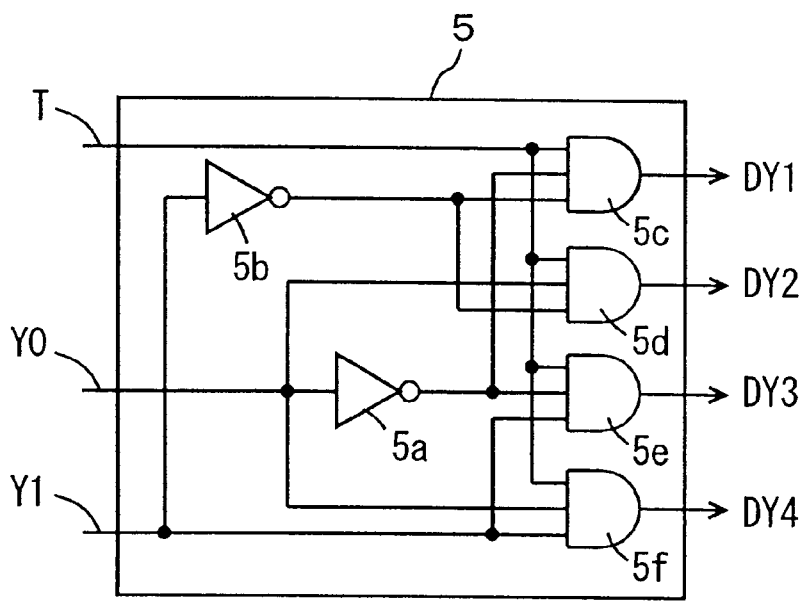
FIG. 5 shows, by way of example, a structure of a column decode circuit shown in FIG. 1.

FIG. 5 shows an example of a structure of column decode circuit 5 shown in FIG. 1. In FIG. 5, column decode circuit 5 includes: an inverter circuit 5a for inverting column address signal Y0; an inverter circuit 5b for inverting column address signal Y1; an AND circuit 5c receiving clock signal T and the output signals of inverter circuits 5a and 5b, for producing column select signal DY1; an AND circuit 5d receiving clock signal T, column address signal Y0 and the output signal of inverter circuit 5b, for producing column select signal DY2; an AND circuit 5e receiving clock signal T, the output signal of inverter circuit 5a and column address signal Y1, for producing column select signal DY3; and an AND circuit 5f receiving clock signal T and column address signals Y0 and Y1, for producing column select signal DY4.

When clock signal T is at L level, all column select signals DY1–DY4 generated from AND circuit 5c–5f are at L level.

When clock signal T attains H level, the column decode operation is performed, and one of column select signals DY1–DY4 is driven to the selected state in accordance with column address signals Y0 and Y1. More specifically, when column address signal Y0 is at L level, one of column select signals DY1 and DY3 designating the odd-numbered columns is driven to the selected state in accordance with column address signal Y1. Conversely, when column address signal Y0 is at H level, one of column select signals DY2 and DY4 designating the even-numbered columns is driven to the selected state in accordance with the column address signal Y1.

When a word line connected to the memory cells in the odd- or even-numbered columns is driven to the selected state in accordance with column address signal Y0 in the word line selecting operation, the column decode circuit drives the column select signal for the odd- or even-numbered column to the selected state in accordance with column address signal Y0. Thus, accurate reading of the memory cell data can be performed.

Figure 20:
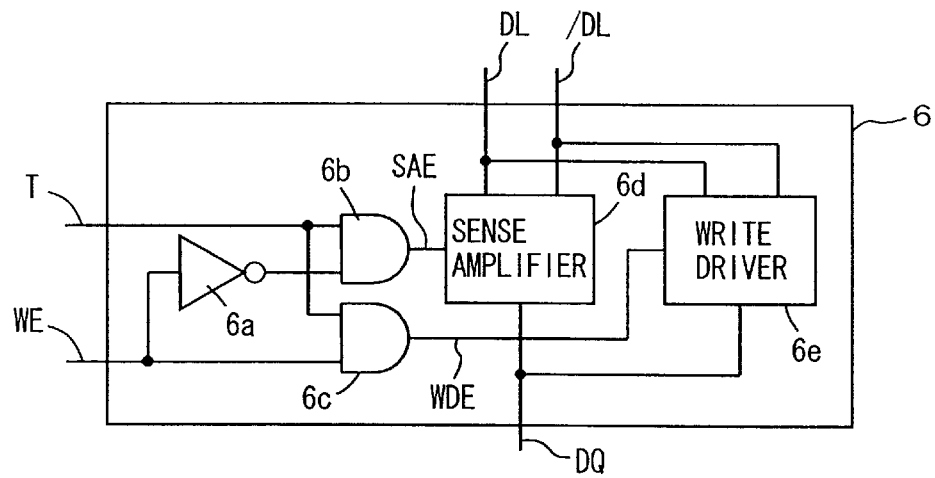
FIG. 20 schematically shows, by way of example, a structure of a read/write circuit shown in FIG. 17.
Figure 21:
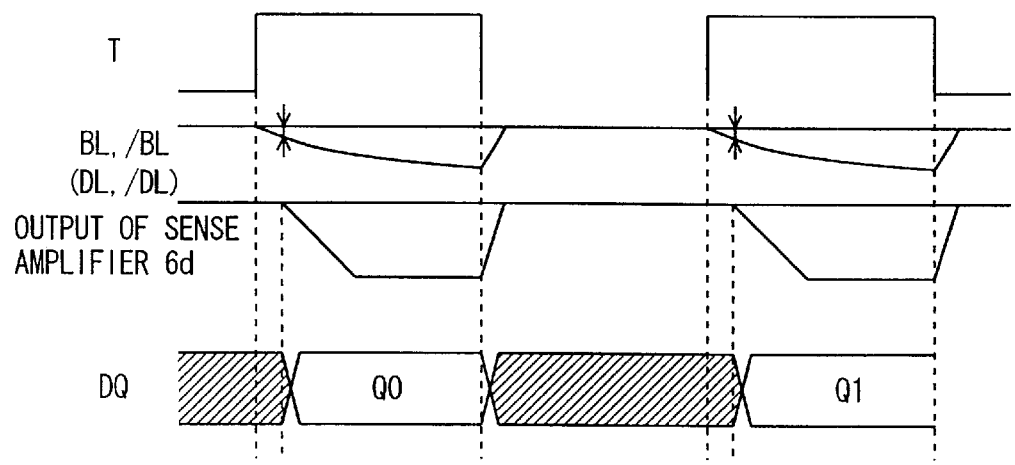
FIG. 21 is a signal waveform diagram representing an operation of data reading in the conventional static semiconductor memory device.

The structure of read/write circuit 6 is the same as the conventional structure as shown in FIG. 20, and the sense amplifier or the write driver included in the read/write circuit is activated in accordance with write signal WE.

[First Modification]

Figure 6:
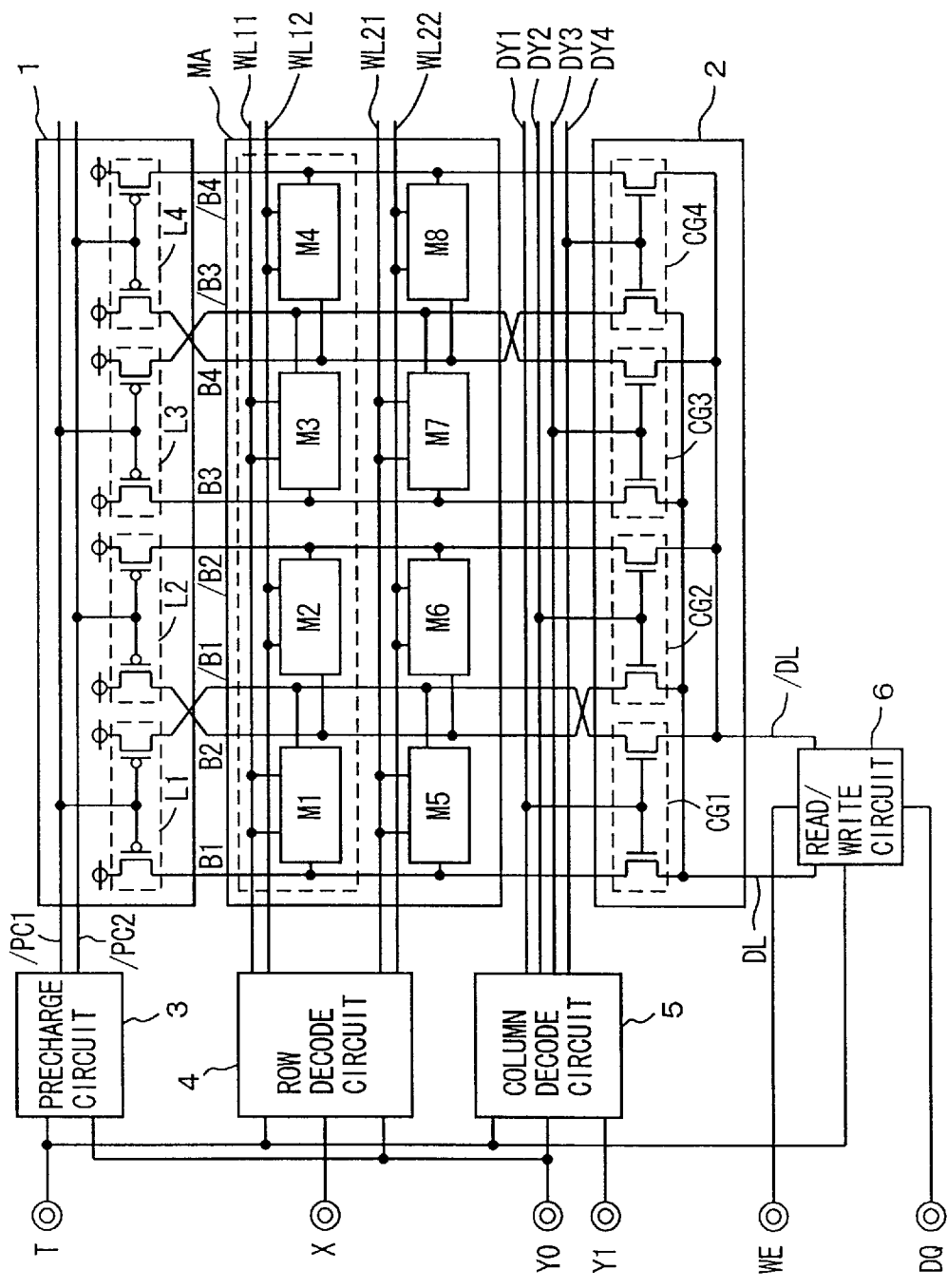
FIG. 6 schematically shows a structure of a modification of a first embodiment of the invention.

FIG. 6 shows a structure of a first modification of the first embodiment of the invention. In the structure shown in FIG. 6, the positions of bit lines B2 and /B1 are interchanged, and the positions of bit lines B4 and /B3 are interchanged, as compared with the arrangement shown in FIG. 1. Therefore, bit line B2 is disposed between bit lines B1 and /B1, and bit line /B1 is disposed between bit lines B2 and /B2. Likewise, bit line B4 is disposed between bit lines B3 and /B3, and bit line /B3 is disposed between bit lines B4 and /B4.

Thus, paired bit lines Bi and /Bi are disposed sandwiching the bit line of another (neighboring) bit line pair, and thus are disposed with the bit line of the adjacent bit line pair laid therebetween. Two word lines are arranged corresponding to each memory cell row, and the memory cells in the even- or odd-numbered columns are simultaneously selected. Accordingly, structures other than the arrangement of the bit lines are the same as those shown in FIG. 1, and the corresponding components are allotted with the same reference characters.

In the structure of the first modification shown in FIG. 6, when a word line (e.g., word line WL11) is selected, complementary data are read onto bit lines B1 and /B1 in the odd-numbered column, and the complementary data of memory cell M3 are read onto bit lines B3 and /B3. However, bit line B2 precharged to the precharge voltage (power supply voltage) is arranged between bit lines B1 and /B1, and functions as a shield layer to prevent capacitive coupling between bit lines B1 and /B1. Likewise, bit line /B2 held in the precharged state is arranged between bit lines /B1 and B3 so that the capacitive coupling between bit lines /B1 and B3 is inhibited. Bit line B4 is disposed between bit lines B3 and /B3. In the case where further memory cells are arranged in the row direction, bit line /B4 is arranged between bit line /B3 and bit line B5 (not shown).

As described above, the bit line held in the precharged state is arranged between the paired bit lines having complementary memory cell data read thereonto, and the bit line thus held in the precharged state functions as a shield layer so that the interference between bit lines can be reliably prevented, and the reduction in voltage between the bit lines in a pair due to the capacitive coupling can be prevented. Therefore, the data can be read out fast. When the memory cell is selected, one of adjacent bit lines /B2 and B3 is held in the precharged state, so that noises due to the capacitive coupling between these bit lines do not occur.

[Second Modification]

Figure 7:
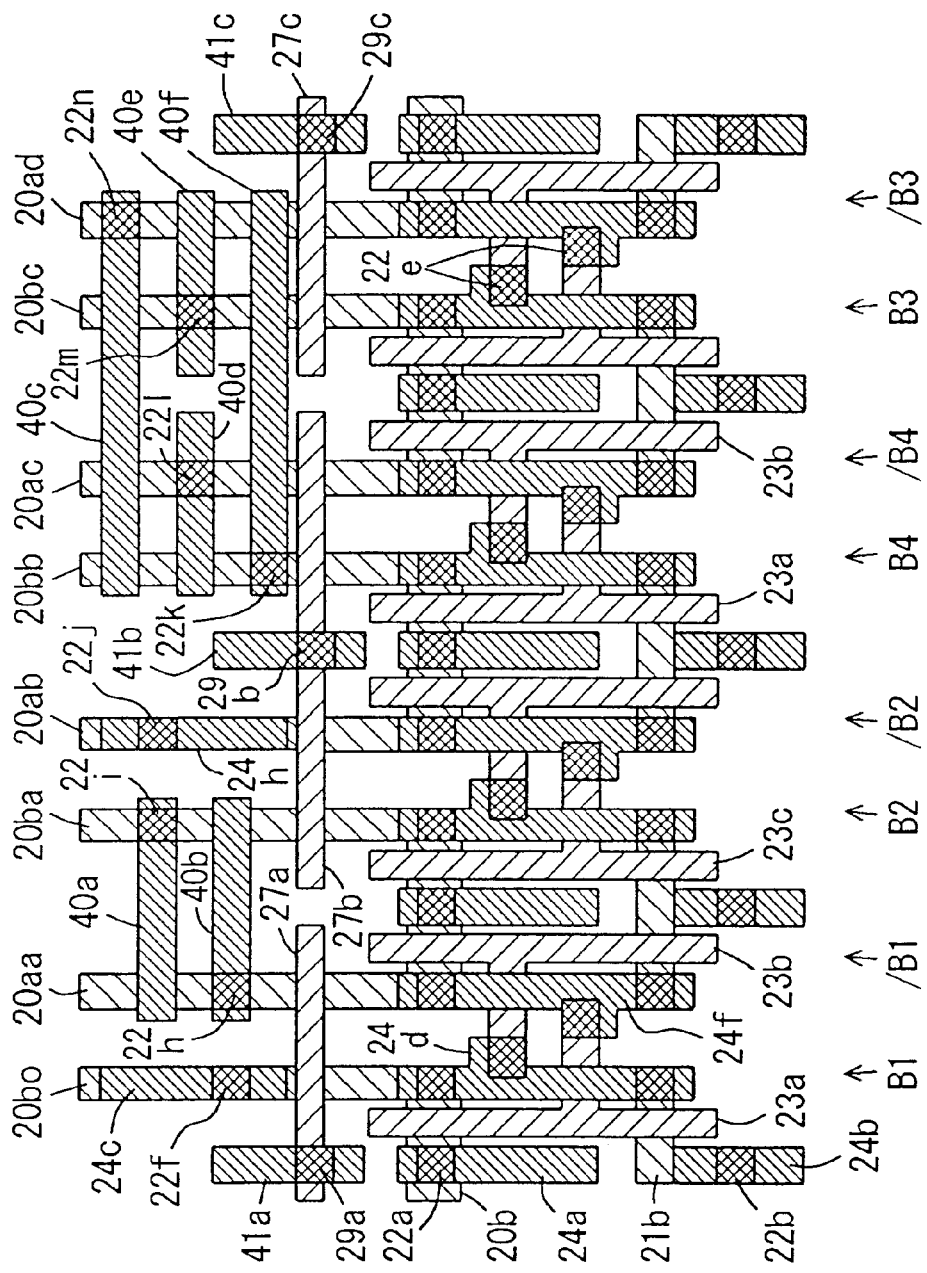
FIG. 7 schematically shows an interconnection line layout in a memory array portion of a semiconductor memory device according to the modification of the first embodiment of the invention.
Figure 22:
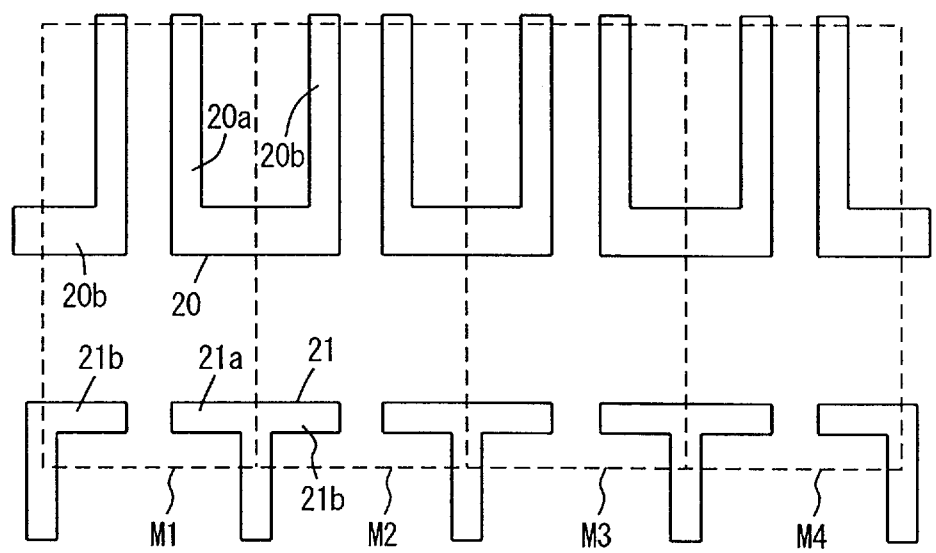
FIG. 22 schematically shows a layout of memory cell transistor forming regions (active regions) of a conventional semiconductor memory device.
Figure 26:
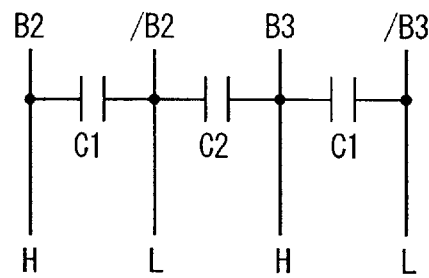
FIG. 26 schematically shows inter-bit-line capacitances in the interconnection line layouts shown in FIGS. 23 to 25.
Figure 27:
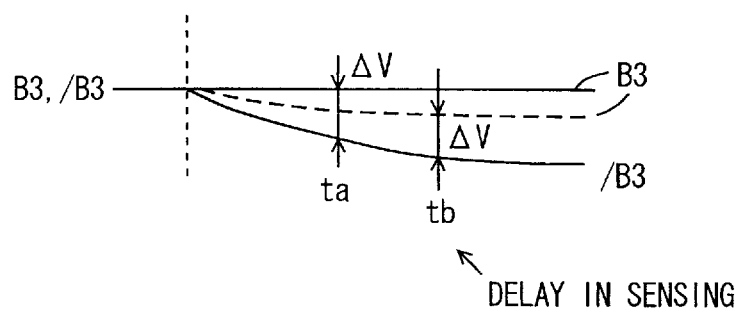
FIG. 27 schematically shows a change in bit line amplitude of a conventional static semiconductor memory device.
Figure 23:
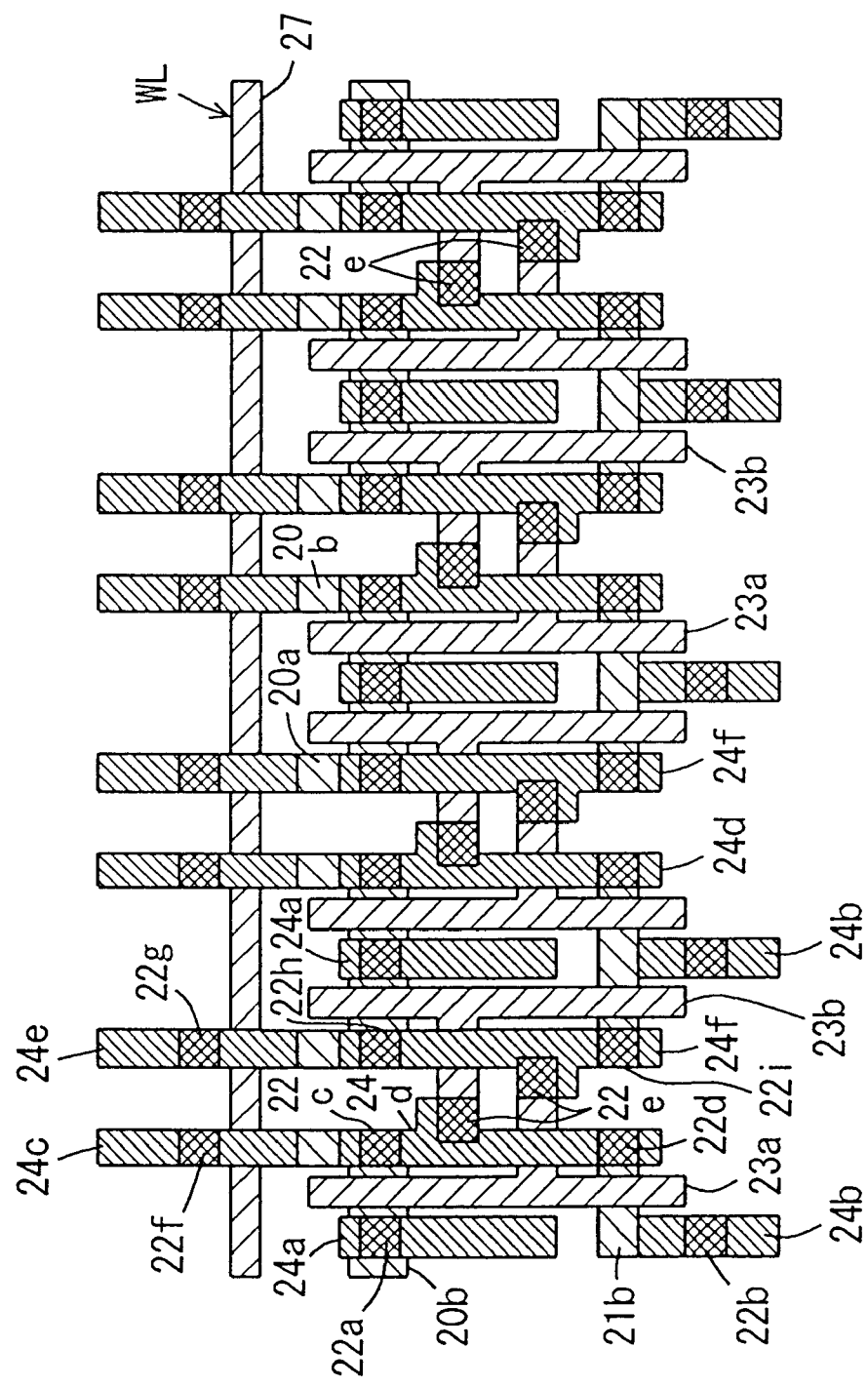
FIG. 23 schematically shows a layout of interconnection lines arranged above the active regions shown in FIG. 22.

FIG. 7 schematically shows an interconnection line layout according to a second modification of the first embodiment of the invention. Similarly to the arrangement shown in FIG. 22, in the arrangement shown in FIG. 7 there are arranged U- and T-shaped semiconductor (active) regions 20 and 21, which are aligned in the row direction, respectively, and provide the semiconductor regions (active regions) for forming the memory cell transistors. The connection between these semiconductor regions for forming the memory cells and first metal interconnection lines 24 at an upper layer is implemented with the same layout as that shown in FIG. 23, and the corresponding portions bear the same reference numbers.

In the memory cell region, polycrystalline silicon interconnection lines 23a and 23b are arranged extending in the column direction within the memory cell region, to form gates of the memory cell transistors. First metal interconnection lines 24a and 24b for forming the source and drain regions of the memory cell transistors are arranged in alignment in the column direction. In the layout shown in FIG. 7, polycrystalline silicon line is arranged in divided forms for forming the word lines. More specifically, polycrystalline silicon interconnection lines 27a, 27b and 27c each provided for the memory cells of two bits are arranged in a divided fashion. Polycrystalline silicon interconnection line 27a is electrically connected to a first metal interconnection line 41a via a first contact 29a. Polycrystalline silicon interconnection line 27b is connected to a first metal interconnection line 41b via a first contact 29b. Polycrystalline silicon interconnection line 27c is connected to a first metal interconnection line 41c via a first contact 29c. Each of polycrystalline silicon interconnection lines 27a–27c is arranged for the memory cells of two bits. FIG. 7 shows the portion, in which polycrystalline silicon interconnection lines 27a and 27c are arranged for the memory cell of one bit.

For connection of the semiconductor regions to the bit lines, a semiconductor region 20bo is connected to first metal interconnection line 24c via first contact 22f. For interchanging the positions of the bit lines, a semiconductor region 20aa is connected to a first metal interconnection line 40b extending in the row direction via a first contact 22h, and a semiconductor region (active region) 20ba is connected to a first metal interconnection line 40a via a first contact 22i. An active region (semiconductor region) 20ab is connected to a first metal interconnection line 24h extending in the column direction via a first contact 22j.

Further, an active region 20bb is connected to a first metal interconnection line 40f extending in the row direction via a first contact 22k. A semiconductor region (active region) 20ac is connected to first metal interconnection line 40d via a first contact 22l.

A semiconductor region 20bc is connected to a first metal interconnection line 40e via a first contact 22m. A semiconductor region (active region) 20ad is connected to a first metal interconnection line 40c via a first contact 22n.

In the interconnection line layout shown in FIG. 7, the memory cells are arranged in the same manner as the conventional device. First metal interconnection lines 40a–40f replace the positions of bit lines. However, for simultaneously selecting the two bit line pairs by one first metal interconnection line, the positions of bit line pair B3 and /B3 and bit line pair B4 and /B4 are interchanged. For simultaneously selecting the bit lines in the even-numbered columns, bit line pair B2 and /B2 are arranged adjacent to bit line pair B4 and /B4. In a lower portion of FIG. 7, the corresponding bit lines are indicated by arrows. In this state, the positions of bit lines are not yet interchanged.

Figure 8:
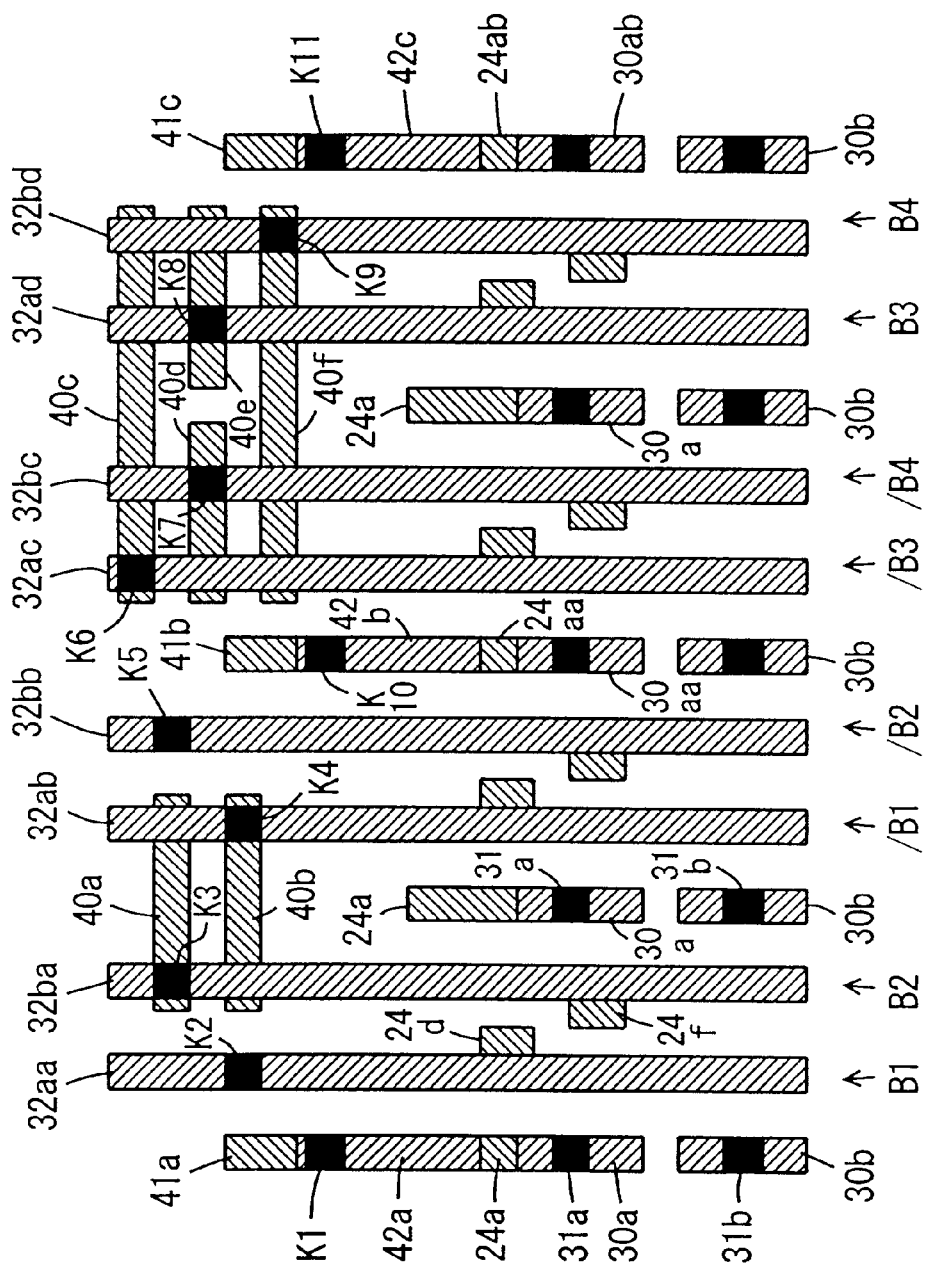
FIG. 8 schematically shows a layout of interconnection lines arranged above the interconnection line layout shown in FIG. 7.
Figure 24:
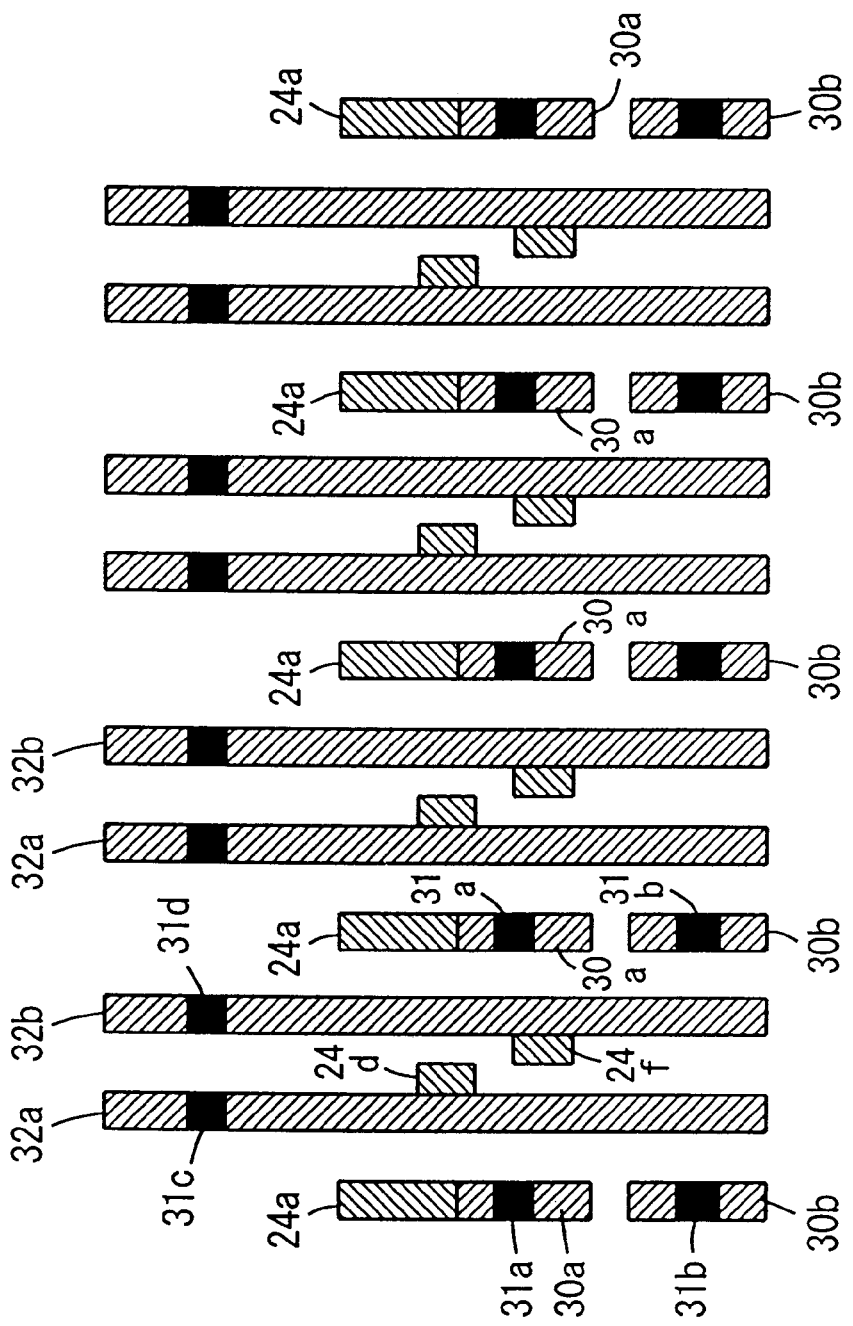
FIG. 24 schematically shows an interconnection line layout at a layer higher than the interconnection line layout shown in FIG. 23.
Figure 25:
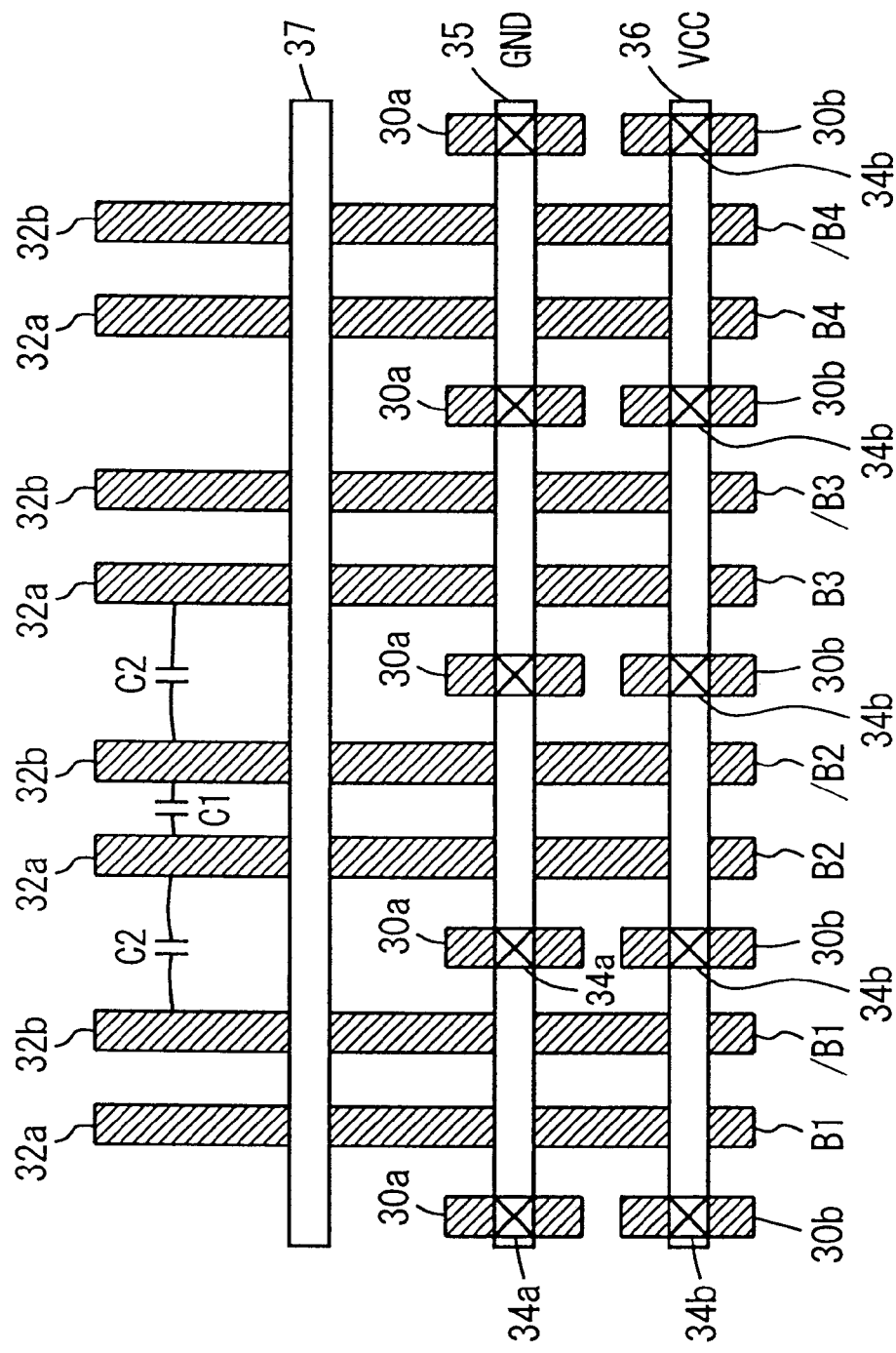
FIG. 25 schematically shows an interconnection line layout at a layer higher than the interconnection line layout shown in FIG. 24.

FIG. 8 schematically shows a layout of interconnection lines arranged above the interconnection line layout shown in FIG. 7. The structure shown in FIG. 8 corresponds to the structure shown in FIG. 24. In FIG. 8, portions corresponding to those in the layout shown in FIG. 24 bear the same reference numbers, respectively.

In the interconnection line layout shown in FIG. 8, first metal interconnection line 41a is electrically connected to a second metal interconnection line 42a via a second contact K1. Second metal interconnection line 42a is aligned to first metal interconnection line 24a.

First metal interconnection line 24c shown in FIG. 7 is electrically connected via a second contact K2 to second metal interconnection line 32aa extending in the column direction.

First metal interconnection line 40a is electrically connected via a second contact K3 to a second metal interconnection line 32ba extending in the column direction and aligned to semiconductor region 20aa.

A second metal interconnection line 32*ab* aligned to semiconductor region 20*ba* is electrically connected to first metal interconnection line 40*b* via a second contact K4. These second metal interconnection lines 32*ba* and 32*ab* serve as bit lines, and these first metal interconnection lines 40*a* and 40*b* interchange the positions of bit lines with each other.

A second metal interconnection line 32*bb* is aligned to semiconductor region 20*ab*. Second metal interconnection line 32*bb* is electrically connected to first metal interconnection line 24*h* shown in FIG. 7 via a second contact K5. Second metal interconnection line 32*bb* operates as bit line/B2, and the position of bit line/B2 corresponding to second metal interconnection line 32*bb* does not change.

A second metal interconnection line 32*ac* extending in the column direction is aligned to semiconductor region (active region) 20*bb*, and a second metal interconnection line 32*bc* is aligned to semiconductor region 20*ac*. Second metal interconnection lines 32*ad* and 32*bd* extending in the column direction are aligned to semiconductor regions 20*bc* and 20*ad*, respectively.

Second metal interconnection line 32*ac* is electrically connected to first metal interconnection line 40*c* via a second contact K6, and second metal interconnection line 32*bc* is electrically connected to first metal interconnection line 40*d* via a second contact K7. Second metal interconnection line 32*ad* is electrically connected to first metal interconnection line 40*e* via a second contact K8, and second metal interconnection line 32*bd* is connected to first metal interconnection line 40*f* via a second contact K9.

Therefore, semiconductor region 20*bb* shown in FIG. 7 is electrically connected to second metal interconnection line 32*bd* via first metal interconnection line 40*f*, and semiconductor region 20*ad* shown in FIG. 7 is electrically connected to second metal interconnection line 32*ac* via first metal interconnection line 40*c*. Semiconductor regions 20*ac* and 20*bc* are connected to second metal interconnection lines 32*bc* and 32*ad* via first metal interconnection lines 40*d* and 40*e*, respectively.

Second metal interconnection lines 42*a*, 42*b* and 42*c*, which are connected to divided polycrystalline silicon interconnection lines 27*a*–27*c*, respectively, are arranged for every the second metal interconnection lines forming the two bit line pairs. Second metal interconnection line 42*a* is electrically connected to first metal interconnection line 41*a* via second contact K1. Second metal interconnection line 42*b* is electrically connected to first metal interconnection line 41*b* via a second contact K10. Second metal interconnection line 42*c* is electrically connected to second metal interconnection line 41*c* via a second contact K11. Second metal interconnection lines 42*a*–42*c* are electrically isolated from first metal interconnection lines 24*a*, 24*aa* and 24*ab* arranged underneath.

Polycrystalline silicon interconnection lines 27*a*, 27*b* and 27*c* shown in FIG. 7 are electrically connected to second metal interconnection lines 42*a*, 42*b* and 42*c* via first metal interconnection lines 41*a*, 41*b* and 41*c*, respectively.

In the interconnection line layout shown in FIG. 8, the positions of bit lines are interchanged so that the bit lines of the same attribute, i.e., complementary bit lines or true bit lines are arranged to form a pair, and the bit lines in a pair are arranged between second metal interconnection lines 30*a* forming the ground nodes, and between second metal interconnection lines 30*b* forming the power supply nodes. Therefore, the layout of the second metal interconnection line is the same as that in the conventional one, except for that the first metal interconnection lines merely change the positions of the bit lines connected to the memory cells. In the lower portion of FIG. 8, the positions of bit lines are indicated by arrows.

Figure 9:
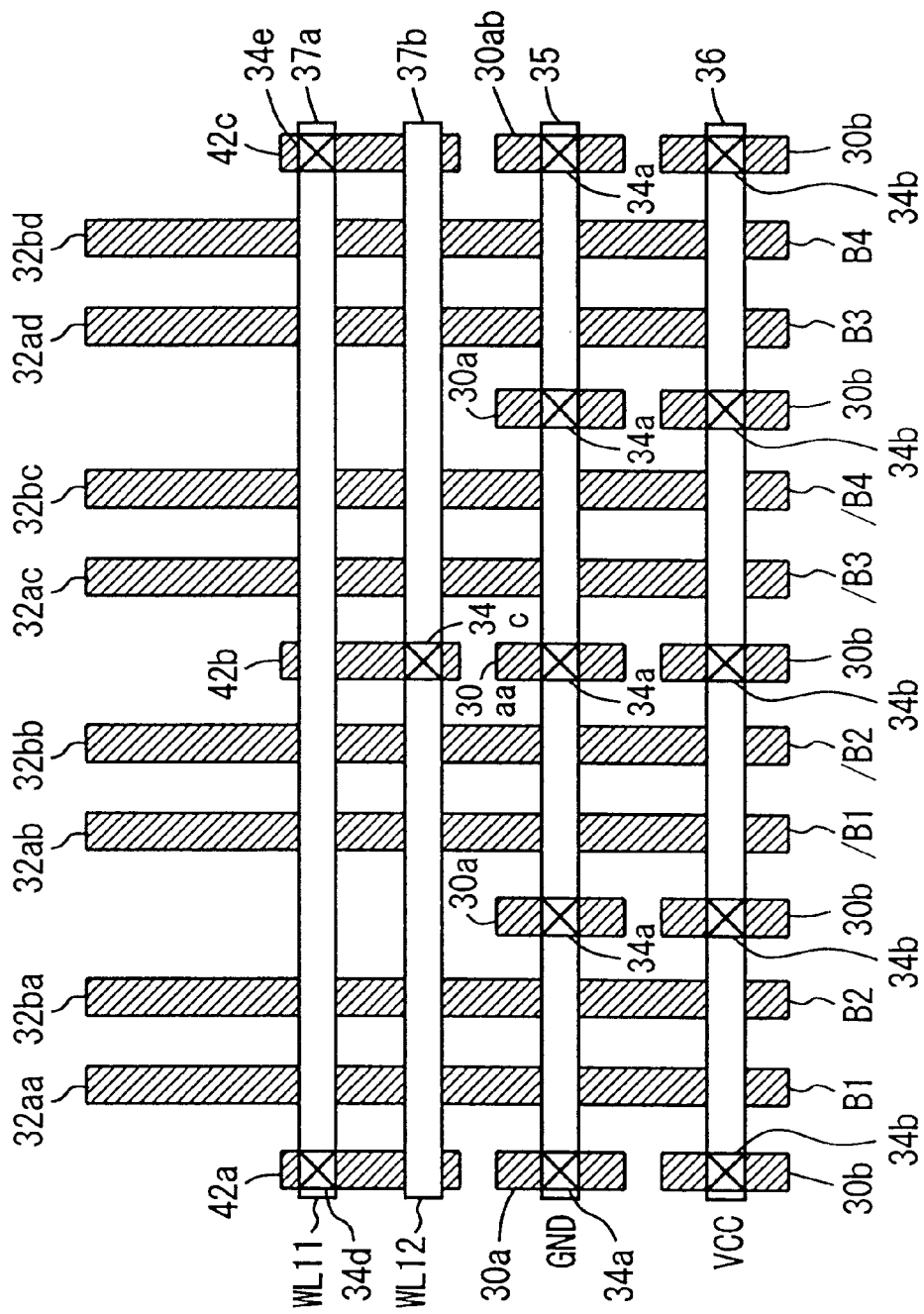
FIG. 9 schematically shows a layout of interconnection lines arranged above the interconnection line layout shown in FIG. 8.

FIG. 9 schematically shows a layout of the interconnection lines arranged above the interconnection line layout shown in FIG. 8. In FIG. 9, third metal interconnection lines 37*a* and 37*b* forming the word lines extend in the row direction, and third metal interconnection lines 35 and 36 are arranged in parallel to third metal interconnection lines 37*a* and 37*b*. Third metal interconnection line 37*a* is electrically connected to second metal interconnection lines 42*a* and 42*c* via third contacts 34*d* and 34*e*, respectively. Third metal interconnection line 37*b* is electrically connected to second metal interconnection line 42*b* via third contact 34*c*.

Third metal interconnection line 35 is electrically connected to second metal interconnection lines 30*a*, 30*aa* and 30*ab* via third contact 34*a*. Third metal interconnection line 36 is electrically connected to second metal interconnection line 30*b* via third contact 34*b*. Third metal interconnection lines 35 and 36 transmit ground voltage GND and power supply voltage VCC, respectively.

Third metal interconnection lines 37*a* and 37*b* serves as word lines WL11 and WL12, respectively. Third metal interconnection line 37*b* is connected to second metal interconnection line 42*b* via third contact 34*c*. When third metal interconnection line 37*b* is selected, polycrystalline silicon interconnection line 27*b* shown in FIG. 7 is supplied with a word line drive signal, and the memory cells connected to semiconductor regions 20*ba*, 20*ab*, 20*bb* and 20*ac* shown in FIG. 7 are simultaneously selected. When word line WL11 is selected, the memory cells located on the opposite sides with respect to second metal interconnection lines 42*a* and 42*c* and arranged beneath are simultaneously selected.

As shown in FIG. 8, the positions of bit lines are interchanged, and second metal interconnection lines 32*aa*, 32*ba*, 32*ab*, 32*bb*, 32*ac*, 32*bc*, 32*ad* and 32*bd* operate as bit lines B1, B2, /B1, /B2, /B3, /B4, B3 and B4, respectively. In the layout shown in FIG. 7, the memory cells connected to semiconductor regions 20*ba*, 20*ab*, 20*bb* and 20*ac* are simultaneously selected, and these semiconductor regions correspond to bit lines B2, /B2, B4 and /B4. By interchanging the positions of bit lines as shown in FIG. 8, the positions of bit lines B2 and /B1 are interchanged, and the positions of bit lines B4 and /B3 are interchanged. The positions of bit lines B1, /B2, /B4 and B3 do not change. According to this layout, the bit lines, which are arranged corresponding to different columns, respectively, are arranged adjacent to each other, and the bit line in the unselected state (precharged state) can be disposed between the bit lines in a pair connected to the selected memory cell. In any pair (set) of the adjacent bit lines, when memory cell data is read onto one of the bit lines, the other bit line maintains the precharged state. Therefore, it is possible to suppress reliably the interference (capacitive coupling) between the bit line pairs as well as the inter-bit-line interference in the bit line pair.

Figure 10:
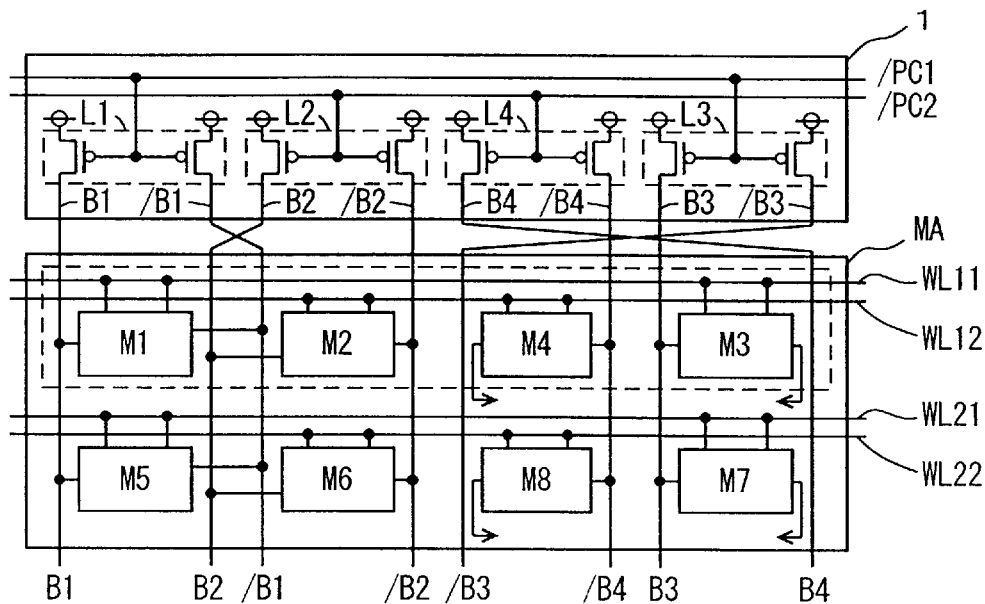
FIG. 10 schematically shows an electrically equivalent circuit of the interconnection line layouts shown in FIGS. 7 to 9.

FIG. 10 shows an electrically equivalent circuit of the second modification of the first embodiment of the invention. In memory cell array MA, the positions of bit lines B2 and /B1 are interchanged, and the positions of bit line B4 and /B3 are interchanged. Bit line pair B2 and /B2 and bit line pair B4 and /B4 are adjacent to each other in the semiconductor regions for forming the memory cells. Memory cells M2 and M4 are arranged adjacent to each other, and memory cells M6 and M8 are adjacent to each other in the row direction. In accordance with a selected word line, the data of the selected memory cell is read onto the bit line pair in either the even-numbered column or the odd-numbered column. In FIG. 10, B2n and /B2n indicate the bit lines in the even-numbered columns, and B(2n+1) and /B(2n+1) indicate the bit lines in the odd-numbered columns.

In the case where the bit line pair (e.g., bit line pair B2 and /B2) in the even-numbered column is selected, bit line B2 is located between bit lines B1 and /B1, and bit line /B2 is located between bit lines /B1 and /B3. Therefore, bit lines B2 and /B2 are shielded by bit lines B1, /B1 and /B3, which are held in the precharged state, and the capacitive coupling noises do not occur between these bit lines B2 and /B2 so that the voltage difference corresponding to the memory cell data can be stably produced between bit lines B2 and /B2. Between bit lines B4 and /B4, bit line B3 is disposed.

By repeating arrangement of the bit lines in the interchanged positions shown in FIG. 10, bit line B5 is disposed adjacent to bit line B4. In this case, bit lines B4 and B5 are not simultaneously selected, and bit line B4 is shielded by bit lines B3 and B5, and is stably maintained at the voltage level corresponding to the memory cell data. In this layout, since the memory cells are disposed in the same manner as those in the conventional device, only the first metal interconnection lines for interchanging the positions of bit lines are additionally required, and the interchange of positions of the bit lines can be easily achieved only by exchanging the mask without increasing the manufacturing steps.

In the interconnection line layouts shown in FIGS. 7 to 9, where the positions of the bit lines are exchanged, the bit line position interchanging layouts shown in FIGS. 7 and 8 are repeated, whereby the connection to the column select gates and the bit line load circuits can be restored to the original state, in which the bit line positions are not interchanged, so that the column select operation and the bit line precharge operation can be accurately performed.

According to the first embodiment of the invention, as described above, the memory cells aligned in one row are arranged such that the memory cells in the adjacent columns are connected to different word lines, respectively, and the bit lines connected to the unselected word lines are maintained in the precharged state so that the interference between the bit lines can be suppressed.

In particular, the bit lines in a pair are disposed sandwiching a bit line of another bit line pair, and this bit line of another bit line pair is maintained in the precharged state. Thus, the bit line in the precharged state can be utilized as the shield layer so that the inter-bit-line interference can be reliably suppressed, and the data reading can be accurately performed.

[Second Embodiment]

Figure 11:
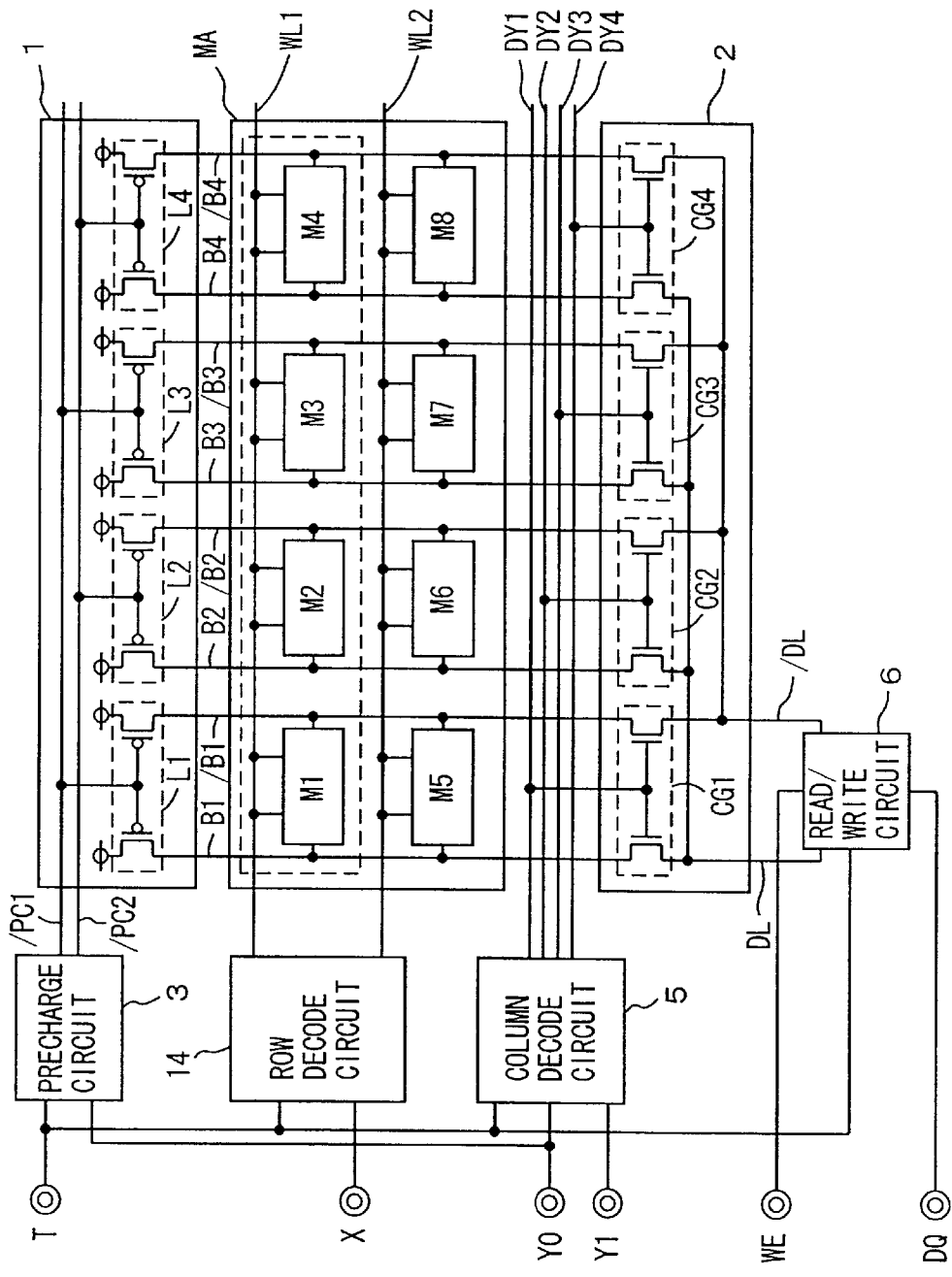
FIG. 11 schematically shows a whole structure of a semiconductor memory device according to a second embodiment of the invention.

FIG. 11 schematically shows a whole structure of a static semiconductor memory device according to a second embodiment of the invention. In the static semiconductor memory device shown in FIG. 11, precharge control circuit 3 is supplied with column address signal Y0, and selectively deactivates precharge signals /PC1 and /PC2 in accordance with column address signal Y0 and clock signal T.

A row decode circuit 14 is supplied with only X-address signal X. In memory cell array MA, one word line WL is arranged corresponding to the row of memory cells, and the memory cells arranged in the same row are connected to the same word line. In FIG. 11, memory cells M1–M4 are connected to word line WL1, and memory cells M5–M8 are connected to word line WL2.

Figure 12:
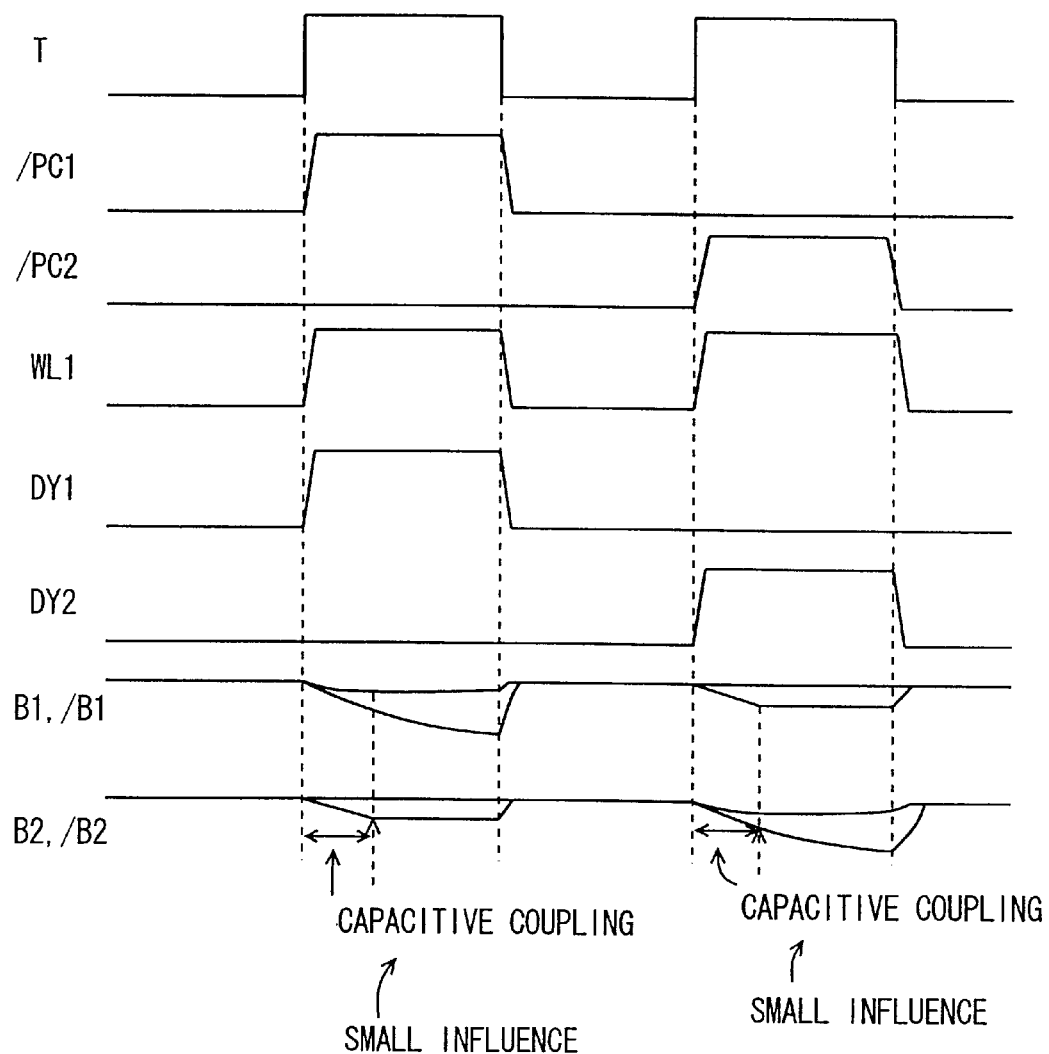
FIG. 12 is a timing chart representing an operation of the semiconductor memory device shown in FIG. 11.
Figure 18A:
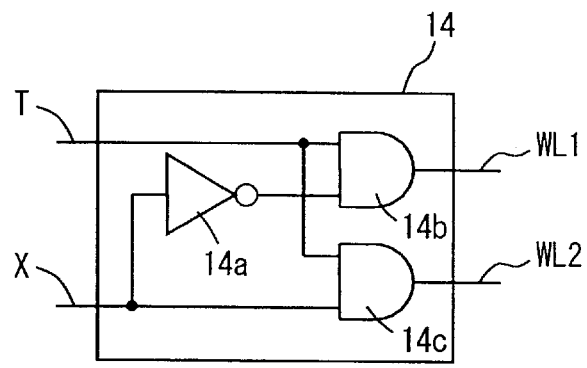
FIG. 18A shows a structure of a row decode circuit shown in FIG. 17.
Figure 18B:
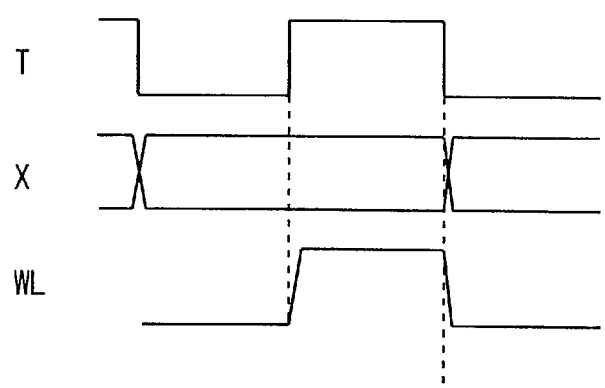
FIG. 18B is a timing chart representing an operation of the row decode circuit shown in FIG. 18A.

Row decode circuit 14 has a structure similar to that shown in FIG. 18A, and drives one of word lines WL1 and WL2 to the selected state in accordance with H- and L-levels of X-address signal X, while dock signal T is at H level. Structures other than the above are the same as those shown in FIG. 1. The corresponding portions bear the same reference numerals or characters, and description thereof is not repeated. An operation of the static semiconductor memory device shown in FIG. 11 will now be described with reference to a timing chart of FIG. 12.

When clock signal T is at L level, precharge control circuit 3 drives both precharge signals /PC1 and /PC2 to L level, and bit line precharge circuit 1 is both activated to precharge all bit line pairs B1 and /B1 to B4 and /B4 to the power supply voltage level.

When clock signal T rises to H level, the memory cell access cycle starts. It is now assumed that column address signal Y0 is at L level, the odd-numbered columns are designated, and X-address signal X designates word line WL1. In this state, precharge control circuit 3 drives precharge signal /PC1 to H level, and maintains precharge signal /PC2 at L level. Row decode circuit 14 drives word line WL1 to the selected state, and column decode circuit 5 drives column select signal DY1 to the selected state.

In this state, when word line WL1 is selected, the data stored in memory cells M1–M4 are read onto bit lines B1 and /B1–B4 and /B4. However, bit line pairs B2 and /B2, and B4 and /B4 in the even-numbered columns are kept at the precharged state by bit line load circuits L2 and L4, respectively. Therefore, the lower voltage levels of bit lines B2 and /B2 and bit lines B4 and /B4 lower due to the column currents flowing through the drive transistors of memory cells M2 and M4, and are stabilized at a certain voltage level determined by the ratio of current drive capability of the load transistors of bit line load circuits L2 and L4 and the drive transistors of the memory cells M2 and M4 and the load capacitance of the bit lines.

Therefore, the influence by the capacitive coupling is affected on bit lines B1 and /B1 and bit lines B3 and /B3 in the odd-numbered columns only while the higher voltage levels of bit lines B2 and /B2 and bit lines B4 and /B4 in the even-numbered columns are lowered. When the voltage levels of bit lines B2 and /B2 and bit lines B4 and /B4 in the even-numbered columns become stable, the influence by the capacitive coupling is no longer exerted, and the H level data on bit line pairs B1 and /B1, and B3 and /B3 are kept at a stable voltage level.

In this case, the bit line voltage difference caused by the column current is extremely small, and the change in voltage by the column current occurs only for an extremely short period. Thus, the influence on the memory cell data read onto the bit lines is small, and the memory cell data can be read out accurately at a faster timing.

When clock signal T falls to L level, memory cell array MA returns to the precharged state. It is assumed that, in the next cycle, word line WL1 is selected again, column address signal Y0 is at H level and column select signal DY2 is driven to the selected state. In this case, precharge signal /PC1 is at L level, precharge signal /PC2 is at H level, and precharging of the odd-numbered bit lines by corresponding bit line load circuits L1 and L3 continues. Meanwhile, bit lines B2 and /B2, and B4 and /B4 in the even-numbered columns have their voltage levels changed in accordance with the memory cell data.

The precharge operation by bit line load circuits L1 and L3 causes the column currents to flow through bit lines B1 and /B1 and bit lines B3 and /B3 in the odd-numbered columns, and the lower voltage level (L level) of these bit lines lowers. Even if the change occurs in bit line voltage due to the column current as already described, the bit line voltages are stably kept at a voltage level predetermined by the on resistances of the load transistors of the bit line load circuits and the drive transistors of the memory cells as well as the bit line resistances. Therefore, the influence by the capacitive coupling can be sufficiently small. Thus, it is possible to reduce the influence by the capacitive coupling noises on the bit lines in the even-numbered columns, and the voltage difference corresponding to the memory cell data can be reliably produced on the bit lines in the even-numbered columns so that the memory cell data can be read out at a faster timing.

As shown in FIG. 11, one word line is provided for each memory cell row, and the unselected column is kept at the precharged state. Consequently, the influence by the inter-bit-line interference can be made small, and a large voltage difference can be produced between the bit lines in the selected column. Therefore, the memory cell data can be read out fast.

[Modification]

Figure 13:
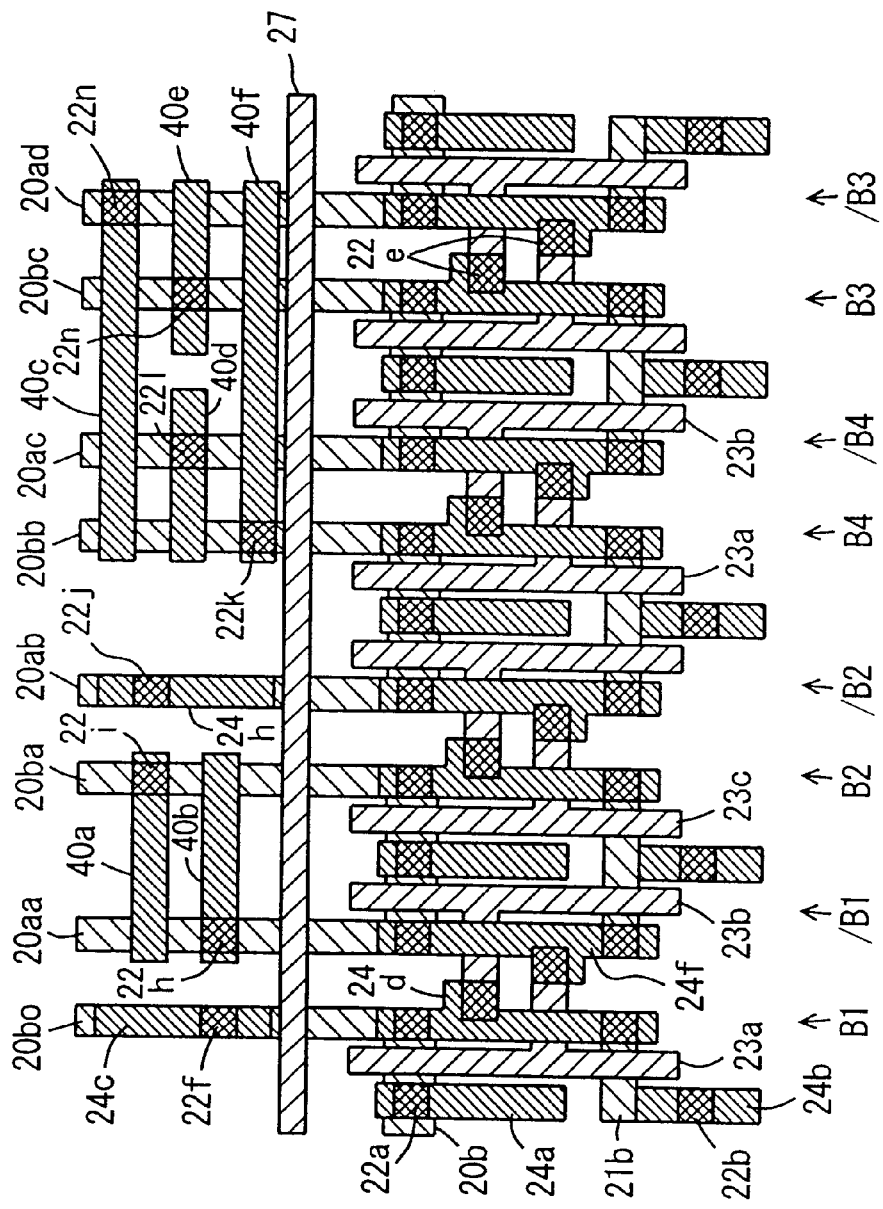
FIG. 13 schematically shows an interconnection line layout of a modification of the second embodiment of the invention.

FIG. 13 schematically shows a modification of the second embodiment of the invention, and specifically shows a layout of the memory cell portion of the static semiconductor memory device. More specifically, FIG. 13 schematically shows an interconnection line layout for four memory cells arranged in one row. The interconnection line layout shown in FIG. 13 is different from the layout shown in FIG. 7 in that a word line is arranged commonly to the memory cells aligned in one row, and therefore polycrystalline silicon interconnection line 27 for the word line continuously extends in the row direction. Therefore, the layout shown in FIG. 13, there are not arranged first metal interconnection lines 41a, 41b and 41c, which are employed in the interconnection line layout shown in FIG. 7 for selectively connecting the word lines to the memory cells at predetermined intervals. Other structures are the same as those shown in FIG. 7. The corresponding portions bear the same reference numerals and characters, and description thereof is not repeated.

Figure 14:
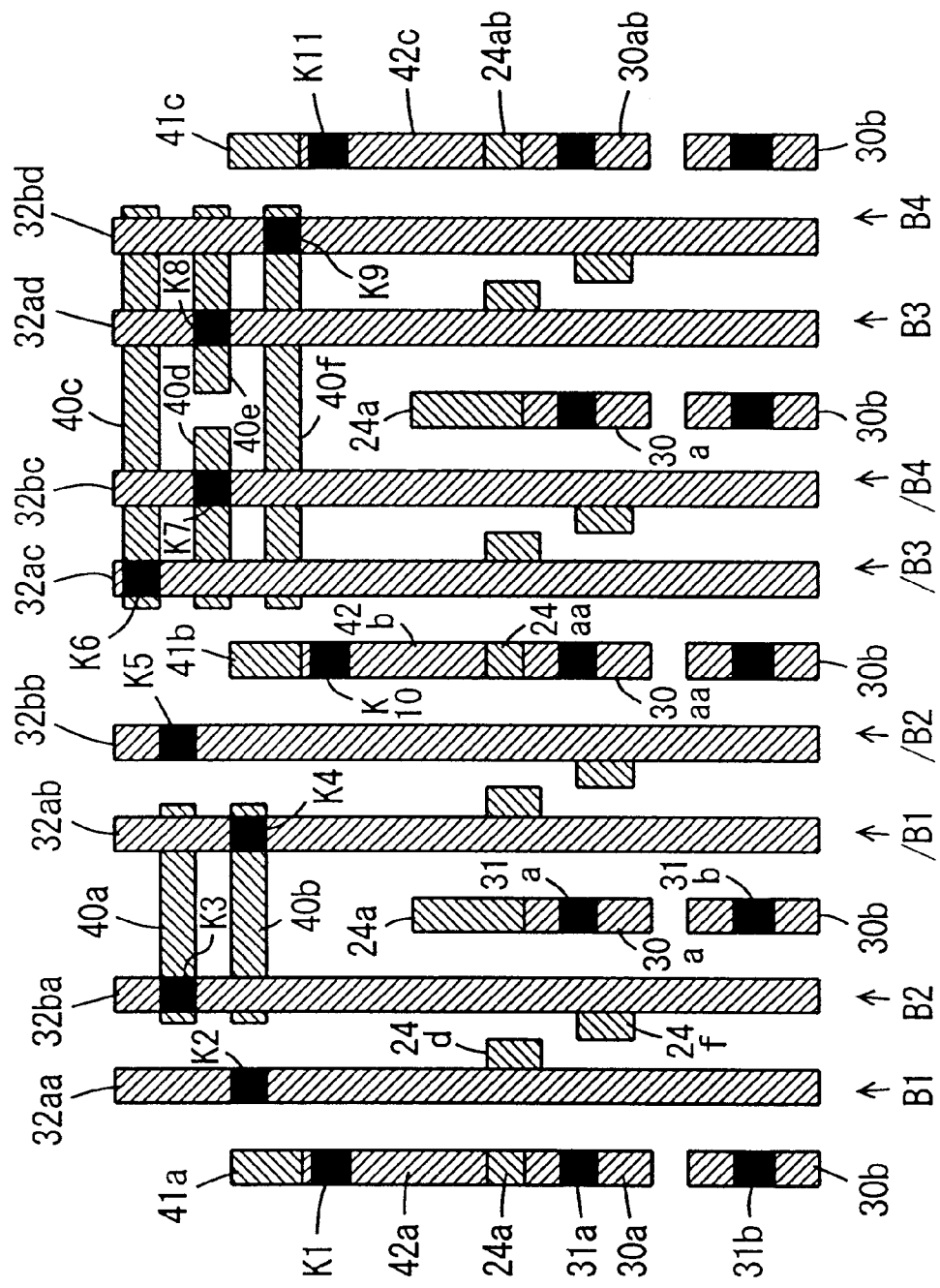
FIG. 14 schematically shows a layout of interconnection lines arranged above the interconnection line layout shown in FIG. 13.

FIG. 14 schematically shows an interconnection line layout arranged above the interconnection line layout shown in FIG. 13. The interconnection line layout shown in FIG. 14 is similar to that shown in FIG. 8. The corresponding portions bear the same reference numerals and characters, and description thereof is not repeated. In the interconnection line layout shown in FIG. 14, second metal interconnection lines 32aa, 32ba, 32ab, 32bb, 32ac, 32bc, 32ad and 32bd form bit lines. First metal interconnection lines 40a–40f are arranged for interchanging the positions of bit lines, and so that the bit lines in one pair are arranged to sandwiching the bit line of another bit line pair.

Figure 15:
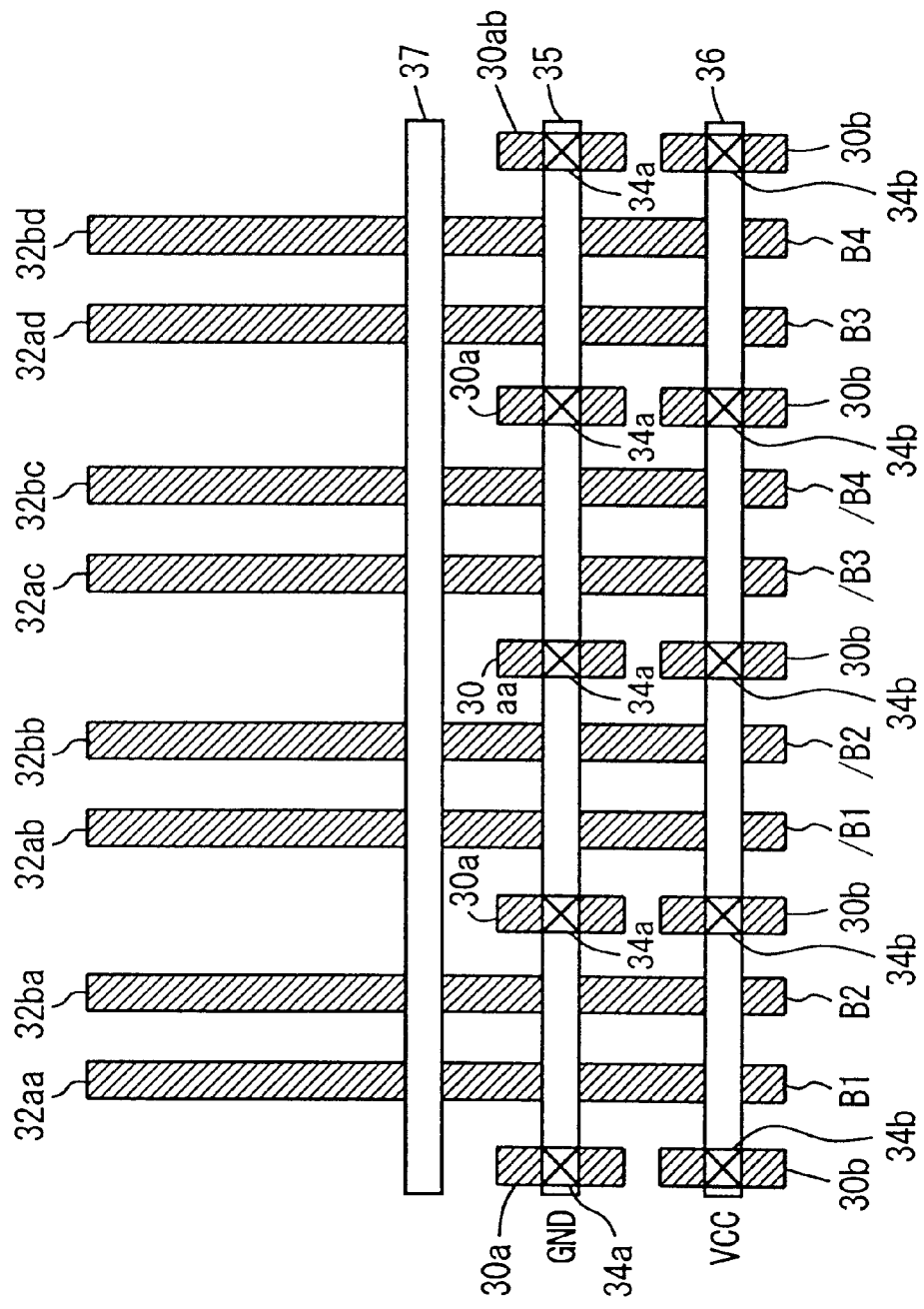
FIG. 15 schematically shows a layout of interconnection lines arranged above the interconnection line layout shown in FIG. 14.
Figure 17:
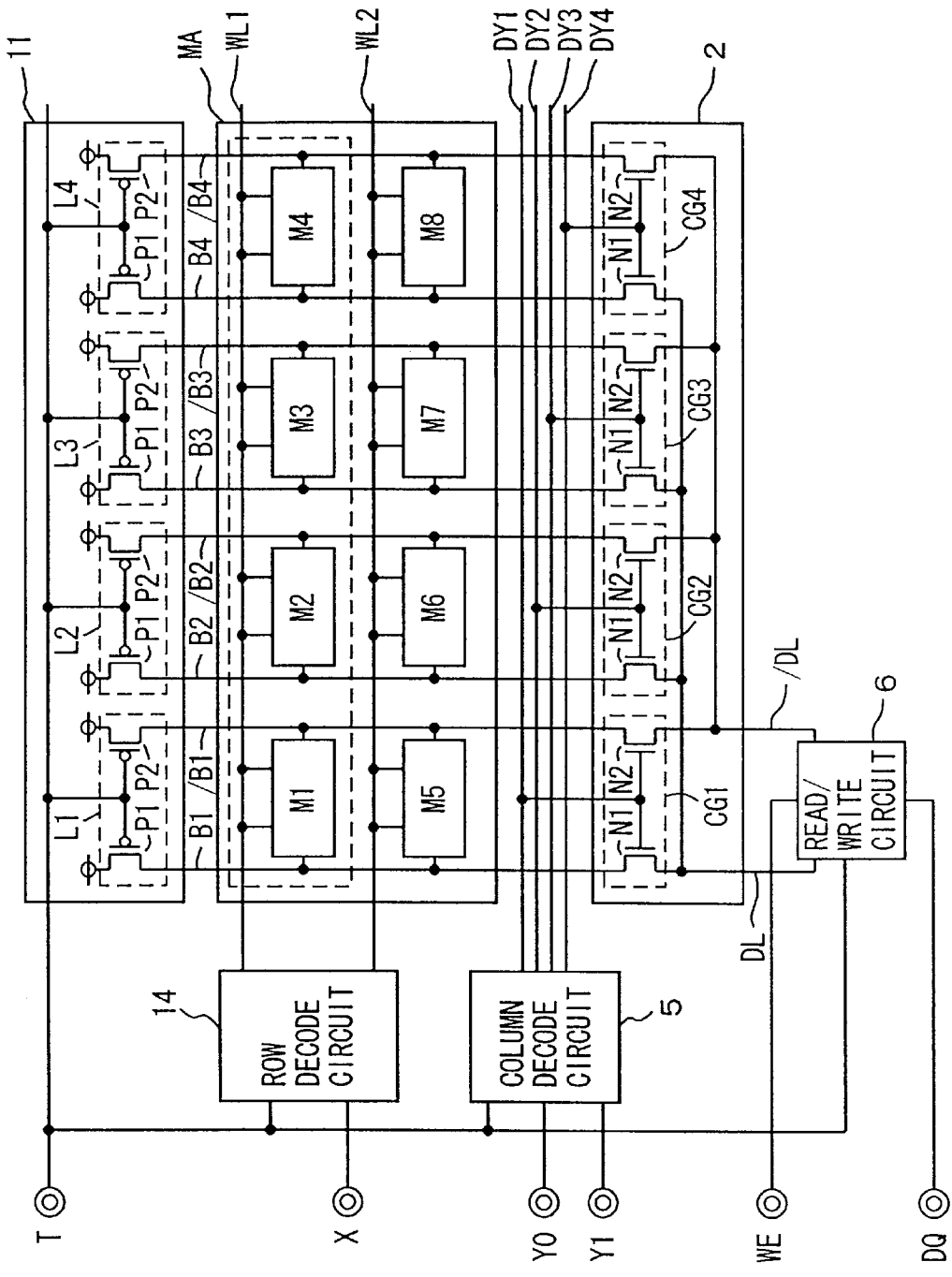
FIG. 17 schematically shows a whole structure of a conventional static semiconductor memory device.

FIG. 15 schematically shows an interconnection layout arranged above the interconnection line layout shown in FIG. 14. In the interconnection line layout shown in FIG. 15, third metal interconnection line 37 continuously extends in the row direction. Third metal interconnection line 37 is electrically connected at a portion (not shown) to polycrystalline silicon interconnection line 27 shown in FIG. 13. The word line has a two-layered structure or double level structure as described above, and therefore transmits the word line drive signal to the memory cells on the same row at high speed. The interconnection line layout shown in FIG. 15 is similar to the interconnection line layout shown in FIG. 9, except for that second metal interconnection lines 42a, 42b and 42c for selectively connecting the word lines to memory cells are not employed. The corresponding portions bear the same reference numerals and characters, and description thereof is not repeated.

Figure 16:
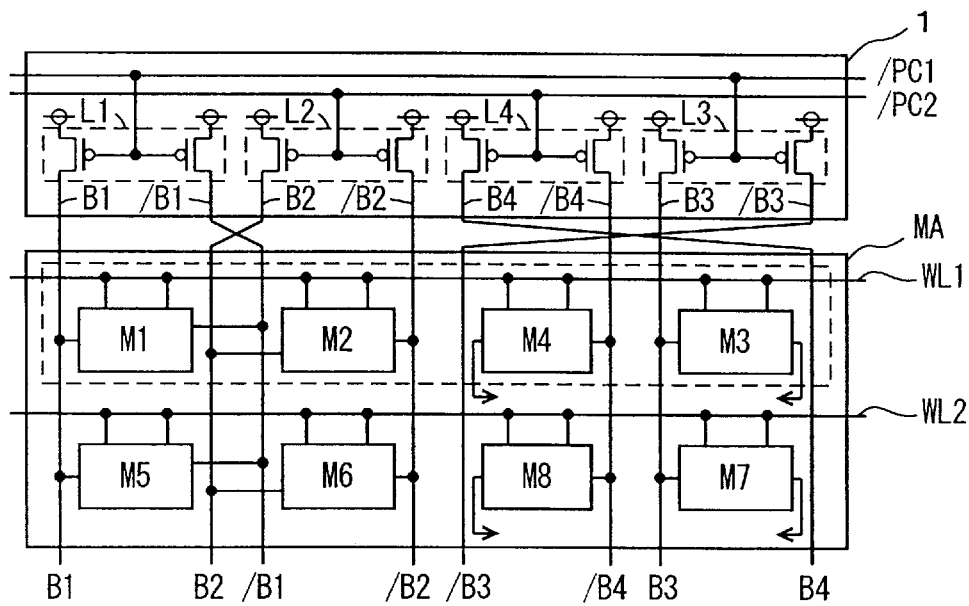
FIG. 16 schematically shows an electrically equivalent circuit of the interconnection line layouts shown in FIGS. 13–15.

FIG. 16 shows an electrically equivalent circuit of the interconnection line layouts shown in FIGS. 13 to 15. Since the positions of bit lines are interchanged in FIG. 16, the column of memory cells M3 and M7 replace the column of memory cell columns M4 and M8 with each other. Further, bit lines B2 and /B1 are interchanged in position with each other, and bit lines B4 and /B3 are interchanged in position with each other. Therefore, the arrangement of bit lines is the same as that of the bit lines in the second modification of the first embodiment, and all the bit lines adjacent to a selected column maintain the precharged state. Further, the paired bit lines in the same column are disposed sandwiching the bit line of the bit line pair on another column, and the bit line interposed between the paired bit lines functions as a shield layer for suppressing the interference between the paired bit lines (since the bit line is held at a constant voltage level after stop of the voltage level lowering, it function as the shield layer).

As compared with the structure shown in FIG. 11, therefore, the inter-bit-line interference can be suppressed more efficiently, and lowering of the voltage level between the paired bit lines can be prevented. Thus, it becomes possible to produce a sufficiently large voltage difference between the bit line in a pair, and thus, the memory cell data can be read out at high speed.

[Other Structure]

The examples, in which the memory cells are arranged in two rows and four columns, have been described as first and second embodiments. Naturally, the memory cell array has the memory cells arranged in multiple rows and multiple columns. The numbers of these rows and columns are not restricted to the described values, and may be determined depending on the storage capacity of the memory device.

In the first and second embodiments, the columns are set to the selected and unselected columns in accordance with the groups of even-numbered columns and odd-numbered columns, to control the activation and deactivation of the corresponding bit line load circuits. The whole layout for it can be easily achieved by repeating the arrangement of the structures of the foregoing first or second embodiment.

In the first and second embodiments described above, the even- and odd-numbered columns are divided into different groups. However, the number of divided groups each including the column(s) may be any, provided that the column adjacent to a selected column is kept at the unselected state. It is merely required that one row is divided into two or more column groups, and only the precharge operation for the column including the selected memory cell is stopped while maintaining the precharge operation for the remaining unselected columns.

The bit line load circuit is repetitively and cyclically activated and deactivated in accordance with clock signal T. This operation is based on the assumption that the memory device of the embodiments is a static semiconductor memory device contained in a processor. However, the bit line precharging may be controlled, e.g., in accordance with an address transition detection signal ATD, as is done in a general static semiconductor memory device.

Such a structure may be employed that address transition detection signal ATD instructs the start of the memory cycle, a word line activation timing signal is internally produced, in accordance with address transition detection signal ATD, to define a word line selection period. In this structure, activation and deactivation of the bit line precharge circuit may be controlled in accordance with the word line activating signal.

In the case where the precharge operation is performed in a one-shot pulse form in accordance with address transition detection signal ATD, such a structure may be employed that the precharge operation in the oneshot pulse form is effected only on the selected column, and the precharge operation for the remaining unselected columns is maintained until next address transition detection signal ATD is applied. This operation can be easily achieved by supplying the column address signal with a circuit for producing the precharge signal of one-shot pulse in accordance with the address transition detection signal. In this structure, the same column may be continuously kept in the unselected state, in which case the bit lines in this column are continuously kept in the precharged state.

According to the invention, as described above, the precharge circuit of the bit line in the unselected column is kept active, and the precharge circuit for the selected column is made inactive so that the interference between bit lines can be suppressed, and thus, the changing rate of the voltage between the bit lines can be increased. Therefore, the data can be read fast.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device comprising:
   a plurality of static memory cells arranged in rows and columns;
   a plurality of word lines arranged corresponding to the rows of the memory cells, the word lines being arranged by a predetermined number per row of the memory cells, the memory cells aligned in one row being connected to predetermined word lines among the predetermined number of word line(s);
   a plurality of bit line pairs, arranged corresponding to the columns of the memory cells, each connected to the memory cells on corresponding columns, the bit lines in each pair being arranged sandwiching a bit line of another bit line pair; and
   a bit line precharge/control circuit for maintaining a bit line adjacent to the bit line corresponding to a selected column in a precharged state in accordance with a column address signal in a memory cell access operation.

2. The static semiconductor memory device according to claim 1, wherein
   said predetermined number is more than one, and
   the memory cell aligned in a common row and located in at least adjacent a column on a one side with respect to each column is connected to a different word line.

3. The static semiconductor memory device according to claim 1, wherein
   said predetermined number is two, and
   one and another of the bit line pairs adjacent to each other in the row direction are in the selected state and in the precharged state in data accessing, respectively.

4. The static semiconductor memory device according to claim 1, wherein
   said predetermined number is one, and
   the memory cells arranged in a same row are connected to a common word line.

5. The static semiconductor memory device according to claim 1, wherein
   said bit line precharge/control circuit includes:
   a plurality of bit line load circuits arranged corresponding to the bit line pairs, for precharging the corresponding bit line pairs when made active, and
   a bit line load control circuit for selectively activating the bit line load circuits in response to a column group designating signal designating a column group of said columns and a clock signal defining an operation cycle.

6. The static semiconductor memory device according to claim 5, wherein
   said clock signal determines a precharging period of the bit line pairs and a memory cell selecting period, and
   said bit line load control circuit activates a bit line load circuit provided for each of said bit line pairs when said clock signal is at a first logical level, and selectively deactivates said plurality of bit line load circuits in accordance with said column group designating signal when said clock signal is at a second logical level.

7. The static semiconductor memory device according to claim 1, wherein
   each of said plurality of bit line pairs includes first and second bit lines for transmitting data complementary to each other when a corresponding memory cell is selected; and
   said plurality of bit line pairs are arranged such that bit lines of a same attribute are arranged adjacent to each other to form a pair, and said attribute identifies the first and second bit lines.

8. The static semiconductor memory device according to claim 1, wherein
   each of said plurality of memory cells includes a latch circuit for latching data, and an access transistor pair for coupling said latch circuit to a corresponding bit line pair in response to a signal on a corresponding word line; and
   each of the bit line pairs includes:
   a first conductive layer for connection to a corresponding access transistor;
   a second conductive layer disposed above said first conductive layer, and extending in a column direction, and
   a third conductive layer for connecting the first and second conductive layers, said third conductive layer including a conductive layer for connecting a corresponding first conductive layer to the second conductive layer arranged for the memory cell arranged in a same row and a different column.

9. The static semiconductor memory device according to claim 8, wherein
   said second conductive layer is coupled to a bit line load circuit included in the bit line precharge/control circuit for precharging a corresponding bit lines to a predetermined precharge voltage level.

10. The static semiconductor memory device according to claim 1, wherein
    each of the memory cells includes: a latch circuit, coupled to first and second power supply nodes receiving first and second power supply voltages, for storing data; and
    an access transistor pair for coupling said latch circuit to the corresponding bit line pair in response to a signal on the corresponding word line, and each of the word lines includes:
- a first conductive layer arranged corresponding to the memory cell, and coupled to the access transistor of the corresponding memory cell for transmitting a row select signal to the corresponding access transistor;
- a main row select line for transmitting a main row select signal generated from a row select circuit; and
- a contact layer for connecting said main row select line to said first conductive layer, and
- power supply contacts for establishing electrical connections between first and second power supply lines for transmitting the first and second power supply voltages and said first and second power supply nodes, and said contact layer are aligned in a direction of said columns, and said contact layer for each of the word lines are arranged in a row direction for each prescribed number of columns, with the prescribed number being more than one.

11. The static semiconductor memory device according to claim 1, wherein
   said bit line precharge/control circuit includes:
      bit line precharge circuitry for maintaining the bit line adjacent to a bit line disposed corresponding to a memory cell connected to a selected word line in the precharged state.

12. The static semiconductor memory device according to claim 1, wherein
   said bit line precharge/control circuit includes bit line precharge circuitry for maintaining one of the bit lines in a pair adjacent to each other in a row direction in the precharged state and for stopping precharging of the other of the bit lines in the pair in a memory cell data reading operation, with said predetermined number being two.

* * * * *